United States Patent
Ichinohe et al.

(10) Patent No.: US 8,760,158 B2
(45) Date of Patent: Jun. 24, 2014

(54) CURRENT SENSOR

(71) Applicant: Alps Green Devices Co., Ltd., Tokyo (JP)

(72) Inventors: Kenji Ichinohe, Niigata-ken (JP);
Masamichi Saito, Niigata-ken (JP);
Akira Takahashi, Niigata-ken (JP);
Yosuke Ide, Niigata-ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 0 days.

(21) Appl. No.: 13/917,525

(22) Filed: Jun. 13, 2013

(65) Prior Publication Data

US 2013/0278251 A1    Oct. 24, 2013

Related U.S. Application Data

(62) Division of application No. 13/038,312, filed on Mar. 1, 2011, now Pat. No. 8,487,612.

(30) Foreign Application Priority Data

Mar. 12, 2010    (JP) .................................. 2010-056154

(51) Int. Cl.
*G01R 33/09* (2006.01)
*G01R 19/00* (2006.01)

(52) U.S. Cl.
USPC ............................ 324/252; 324/610; 324/713

(58) Field of Classification Search
USPC ........................................................ 324/252
See application file for complete search history.

(56) References Cited

U.S. PATENT DOCUMENTS

| | | | | |
|---|---|---|---|---|
| 5,561,368 A * | 10/1996 | Dovek et al. | ................... | 324/252 |
| 6,970,332 B2 * | 11/2005 | Tetsukawa et al. | ......... | 360/324.1 |
| 7,336,070 B2 * | 2/2008 | Sasaki et al. | ............. | 324/207.21 |
| 7,460,343 B2 * | 12/2008 | Carey et al. | ............. | 360/324.12 |
| 7,533,456 B2 * | 5/2009 | Tsuchiya et al. | ........... | 29/603.14 |

(Continued)

FOREIGN PATENT DOCUMENTS

| | | |
|---|---|---|
| JP | 7-318591 | 12/1995 |
| JP | 8-15322 | 1/1996 |

(Continued)

OTHER PUBLICATIONS

Notice of Allowance dated Jul. 27, 2012 from U.S. Appl. No. 12/891,550.

(Continued)

*Primary Examiner* — Bot Ledynh
(74) *Attorney, Agent, or Firm* — Beyer Law Group LLP

(57) ABSTRACT

A current sensor including a magnetic detecting bridge circuit which is constituted of four magneto-resistance effect elements with a resistance value varied by application of an induced magnetic field from a current to be measured, and which has an output between two magneto-resistance effect elements. The four magneto-resistance effect elements have the same resistance change rate, and include a self-pinned type ferromagnetic fixed layer which is formed by anti-ferromagnetically coupling a first ferromagnetic film and a second ferromagnetic film via an antiparallel coupling film therebetween, a nonmagnetic intermediate layer, and a soft magnetic free layer. Magnetization directions of the ferromagnetic fixed layers of the two magneto-resistance effect elements providing the output are different from each other by 180°. The magnetic detecting bridge circuit has wiring symmetrical to a power supply point.

11 Claims, 11 Drawing Sheets

(56) References Cited

U.S. PATENT DOCUMENTS

| | | | |
|---|---|---|---|
| 7,554,775 B2* | 6/2009 | Li et al. | 360/324.11 |
| 7,639,005 B2* | 12/2009 | Qian et al. | 324/252 |
| 8,269,492 B2 | 9/2012 | Saito et al. | |
| 8,519,704 B2 | 8/2013 | Ide et al. | |
| 8,564,282 B2* | 10/2013 | Hoshiya et al. | 324/207.25 |
| 2004/0213071 A1* | 10/2004 | Hiramoto et al. | 365/232 |
| 2004/0223266 A1* | 11/2004 | Li | 360/324.1 |
| 2004/0246632 A1* | 12/2004 | Nishioka et al. | 360/324.11 |
| 2005/0237676 A1 | 10/2005 | Gill | |
| 2006/0002038 A1 | 1/2006 | Gill | |
| 2006/0012927 A1 | 1/2006 | Seino et al. | |
| 2006/0077598 A1 | 4/2006 | Taylor et al. | |
| 2007/0076469 A1* | 4/2007 | Ashida et al. | 365/158 |
| 2007/0091509 A1* | 4/2007 | Yi et al. | 360/313 |
| 2007/0200564 A1* | 8/2007 | Motz et al. | 324/247 |
| 2007/0297220 A1* | 12/2007 | Yoshikawa et al. | 365/158 |
| 2008/0052896 A1* | 3/2008 | Tsuchiya et al. | 29/603.01 |
| 2008/0054897 A1* | 3/2008 | Crolly et al. | 324/252 |
| 2008/0070063 A1 | 3/2008 | Ibusuki et al. | |
| 2008/0180863 A1* | 7/2008 | Gill | 360/324.2 |
| 2008/0274270 A1* | 11/2008 | Wakui et al. | 427/128 |
| 2009/0027813 A1* | 1/2009 | Carey et al. | 360/324.12 |
| 2010/0141251 A1 | 6/2010 | Ando et al. | |
| 2011/0043201 A1* | 2/2011 | Zhou | 324/252 |
| 2011/0121826 A1* | 5/2011 | Engel et al. | 324/249 |
| 2012/0062224 A1 | 3/2012 | Ide et al. | |
| 2012/0306491 A1 | 12/2012 | Ide et al. | |
| 2012/0326715 A1 | 12/2012 | Ide et al. | |

FOREIGN PATENT DOCUMENTS

| | | |
|---|---|---|
| JP | 8-179023 | 7/1996 |
| JP | 2000-516714 | 12/2000 |
| JP | 2004-132790 | 4/2004 |
| JP | 2006-125962 | 5/2006 |
| JP | 2007-147460 | 6/2007 |
| JP | 2007-248054 | 9/2007 |
| JP | 2007-263654 | 10/2007 |
| JP | 2008-516255 | 5/2008 |
| JP | 2008-151528 | 7/2008 |
| JP | 2008-275321 | 11/2008 |
| JP | 2008-275566 | 11/2008 |
| JP | 2008-286739 | 11/2008 |
| JP | 2008-306112 | 12/2008 |
| JP | 2009-180604 | 8/2009 |
| JP | 2010-14686 | 1/2010 |
| WO | WO 98/07165 | 2/1998 |

OTHER PUBLICATIONS

International Search Report dated May 31, 2011 from International Application No. PCT/JP2011/055185.

Office Action dated Jul. 11, 2013 from U.S. Appl. No. 13/300,064.

Search Report dated Aug. 17, 2010 from International Application No. PCT/JP2010/059959.

Parkin, "Spin Dependent Transport in Magnetic Nanostructures", Ch. 5, pp. 237-277, 2002.

Search Report dated Aug. 17, 2010 from International Application No. PCT/JP2010/059791.

Final Office Action dated Nov. 26, 2013 from U.S. Appl. No. 13/300,064.

Search Report dated May 24, 2011 from International Application No. PCT/JP2011/054082.

* cited by examiner

CURRENT SENSOR

CLAIM OF PRIORITY

This application is a Divisional of U.S. patent application Ser. No. 13/038,312 filed on Mar. 1, 2011, which claims benefit of Japanese Patent Application No. 2010-056154 filed on Mar. 12, 2010, which is hereby incorporated by reference.

BACKGROUND OF THE INVENTION

1. Field of the Invention

The present invention relates to a current sensor using a magneto-resistance effect element (TMR element or GMR element).

2. Description of the Related Art

In an electric vehicle, a motor is driven by electricity generated by an engine, and the intensity of the current for driving the motor is detected by, for example, a current sensor. The current sensor includes a magnetic core placed around a conductor and having a cutaway portion (core gap) formed at a portion thereof, and a magnetic detecting element placed in the core gap.

As the magnetic detecting element of the current sensor, a magneto-resistance effect element (GMR element, TMR element) including a laminate structure having a fixed magnetic layer with a fixed magnetizing direction, a nonmagnetic layer, and a free magnetic layer with a magnetizing direction varied with respect to an external magnetic field, or the like is used. Such a current sensor includes a full-bridge circuit constituted by a magneto-resistance effect element and a fixed resistance element (Japanese Unexamined Patent Application Publication No. 2007-248054).

As the current sensor including a magnetic detecting bridge circuit (magnetic field detecting bridge circuit) constituted by the magneto-resistance effect element and the fixed resistance element, for example, there is a magnetic balance current sensor shown in FIGS. 16 and 17. The magnetic balance current sensor measures a current to be measured based on a current flowing in a feedback coil when the feedback coil is energized by a voltage difference obtained by a magnetic detecting bridge circuit 2, and then an induced magnetic field generated by the current I to be measured which energizes a conductor 1, and a cancelling magnetic field generated by the feedback coil are in an equilibrium state in which they are cancelled.

The magnetic detecting bridge circuit 2 of the current sensor shown in FIG. 16 includes one magneto-resistance effect element 201 and three fixed resistance elements 202a to 202c. In the magnetic detecting bridge circuit 2, a resistance value of the magneto-resistance effect element 201 on a zero magnetic field is identical to a resistance value of the fixed resistance elements 202a to 202c (Rcom). In addition, an output between the fixed resistance elements 202b and 202c is set to Out1, and an output between the magneto-resistance effect element 201 and the fixed resistance element 202a is set to Out2. In addition, a resistance value of the fixed resistance element 202b is set to R1, a resistance value of the fixed resistance element 202a is set to R2, a resistance value of the fixed resistance element 202c is set to R3, and a resistance value of the magneto-resistance effect element 201 is set to R4.

When a resistance change amount of the magneto-resistance effect element 201 according to the induced magnetic field generated from the current I to be measured is $\Delta R$, a midpoint potential difference (Out1 and Out2) of the bridge is obtained as follows:

Resistance between $Vdd$ and $Gnd1 = R1 - R3 = 2 \times R_{com}$

Resistance between $Vdd$ and $Gnd2 = R2 + (R4 - \Delta R) = 2 \times R_{com} - \Delta R$ Potential of $Out1 = (R_{com})/(2 \times R_{com}) \times Vdd$ Potential of $Out2 = (R_{com} - \Delta R)/(2 \times R_{com} - \Delta R) \times Vdd$ Potential difference between Out1 and Out2 $= \Delta R/\{2 \times (2 \times R_{com} - \Delta R)\} \times Vdd$ The magnetic detecting bridge circuit 2 of the current sensor shown in FIG. 17 includes two magneto-resistance effect elements 201a and 201b, and two fixed resistance elements 202a and 202b. In the magnetic detecting bridge circuit 2, resistance values of the magneto-resistance effect elements 201a and 201b are equal to resistance values of the fixed resistance elements 202a and 202b ($R_{com}$). In addition, resistance change rates of the magneto-resistance effect elements 201a and 201b are equal to each other. Moreover, the output between the magneto-resistance effect element 201b and the fixed resistance element 202b is set to Out1, and the output between the magneto-resistance effect element 201a and the fixed resistance element 202a is set to Out2. Further, a resistance value of the magneto-resistance effect element 201b is set to R1, a resistance value of the fixed resistance element 202a is set to R2, a resistance value of the fixed resistance element 202b is set to R3, and a resistance value of the magneto-resistance effect element 201a is set to R4.

When a resistance change amount of the magneto-resistance effect elements 201a and 201b by the induced magnetic field generated from the current I to be measured is $\Delta R$, a midpoint potential difference (Out1 and Out2) of the bridge is obtained as follows:

Resistance between $Vdd$ and $Gnd1 = (R1 - \Delta R) + R3 = 2 \times R_{com} - \Delta R$ Resistance between $Vdd$ and $Gnd2 = R2 + (R4 - \Delta R) = 2 \times R_{com} - \Delta R$ Potential of $Out1 = (R_{com})/(2 \times R_{com} - \Delta R) \times Vdd$ Potential of $Out2 = (R_{com} - \Delta R)/(2 \times R_{com} - \Delta R) \times Vdd$ Potential difference between Out1 and Out2 $= \Delta R/(2 \times R_{com} - \Delta R) \times Vdd$ However, in the configuration of the magnetic detecting bridge circuit shown in FIGS. 16 and 17, a term $\Delta R$ is contained in a denominator in the equation of the midpoint potential difference of the bridge. For this reason, there is a problem that the output of the midpoint potential difference is not varied completely in proportion to the induced magnetic field which is generated by the current I to be measured, and thus the measurement accuracy is deteriorated.

SUMMARY OF THE INVENTION

Accordingly, the present invention is made to solve the above problems of related arts, and an object of the present invention is to provide a current sensor in which an output of a midpoint potential difference is varied in proportion to an induced magnetic field, thereby measuring a current with a high degree of accuracy.

According to an aspect of the present invention, there is provided a current sensor including: a magnetic detecting bridge circuit which is constituted of four magneto-resistance effect elements with a resistance value varied by application of an induced magnetic field from a current to be measured, and has an output between two magneto-resistance effect elements; wherein the four magneto-resistance effect elements have the same resistance change rate, and include a self-pinned type ferromagnetic fixed layer which is formed by anti-ferromagnetically coupling a first ferromagnetic film and a second ferromagnetic film via an antiparallel coupling film therebetween, a nonmagnetic intermediate layer, and a soft magnetic free layer, the magnetization directions of the ferromagnetic fixed layers of the two magneto-resistance effect elements providing the output are different from each other by 180°, and the magnetic detecting bridge circuit has a wiring symmetrical to a power supply point.

With the configuration, since the magnetization directions of the self-pinned type ferromagnetic fixed layers in two magneto-resistance effect elements outputting the midpoint potential are different from each other by 180°, the output of the midpoint potential difference is changed in proportion to the induced magnetic field which is generated from the current to be measured, and it is possible to carry out the current measurement with a high degree of accuracy. In addition, since the wiring is symmetrical to the power supply point in the magnetic detecting bridge circuit, there is no difference in the wiring resistances in the magnetic detecting bridge circuit, and it is possible to carry out the current measurement with a higher degree of accuracy.

It is desirable that the current sensor according to the present invention further includes a feedback coil which is placed in the vicinity of the magneto-resistance effect element, and generates a cancelling magnetic field for cancelling the induced magnetic field; and a magnetic shield which attenuates the induced magnetic field and enhances the cancelling magnetic field, wherein the current to be measured is measured based on a current flowing in the feedback coil at the time of an equilibrium state in which the induced magnetic field and the cancelling magnetic field are cancelled by energizing the feedback coil with a voltage difference obtained from the magnetic detecting bridge circuit.

In the current sensor according to the present invention, it is desirable that in the four magneto-resistance effect elements, a plurality of belt-like elongated patterns are placed in such a way that longitudinal directions thereof are parallel with each other by again bending the elongated pattern, and the induced magnetic field and the cancelling magnetic field are applied in a direction perpendicular to the longitudinal direction.

In the current sensor according to the present invention, it is desirable that the magnetic detecting bridge circuit measures the current to be measured by the outputs of the four magneto-resistance effect elements which are in proportion to the induced magnetic field.

In the current sensor according to the present invention, it is desirable that the first ferromagnetic film is made of a CoFe alloy containing Fe of 40 atomic percent to 80 atomic percent, and the second ferromagnetic film is made of a CoFe alloy containing Fe of 0 atomic percent to 40 atomic percent.

In the current sensor according to the present invention, it is desirable that the magnetic shield is made of a high permeability material selected from a group consisting of an amorphous magnetic material, a permalloy-based magnetic material, and an iron-based microcrystalline material.

With the present invention, the current sensor includes the magnetic detecting bridge circuit which is constituted of four magneto-resistance effect elements with the resistance value varied by application of the induced magnetic field from the current to be measured, and which has output between two magneto-resistance effect elements. The four magneto-resistance effect elements have the same resistance change rate, and includes the self-pinned type ferromagnetic fixed layer which is formed by anti-ferromagnetically coupling the first ferromagnetic film and the second ferromagnetic film via the antiparallel coupling film therebetween, the nonmagnetic intermediate layer, and the soft magnetic free layer. The magnetization directions of the ferromagnetic fixed layers of the two magneto-resistance effect elements providing the output are different from each other by 180°, and the magnetic detecting bridge circuit has a wiring symmetrical to a power supply point. As a result, the output of the midpoint potential difference is changed in proportion to the induced magnetic field which is generated from the current to be measured, and there is no difference in the wiring resistances in the magnetic detecting bridge circuit. Therefore, it is possible to carry out the current measurement with a high degree of accuracy.

DESCRIPTION OF THE PREFERRED EMBODIMENTS

Embodiments of the present invention will be now described in detail with reference to the accompanying drawings. First, a case where a current sensor according to the present invention is a magnetic balance current sensor will be described.

Figure 1:
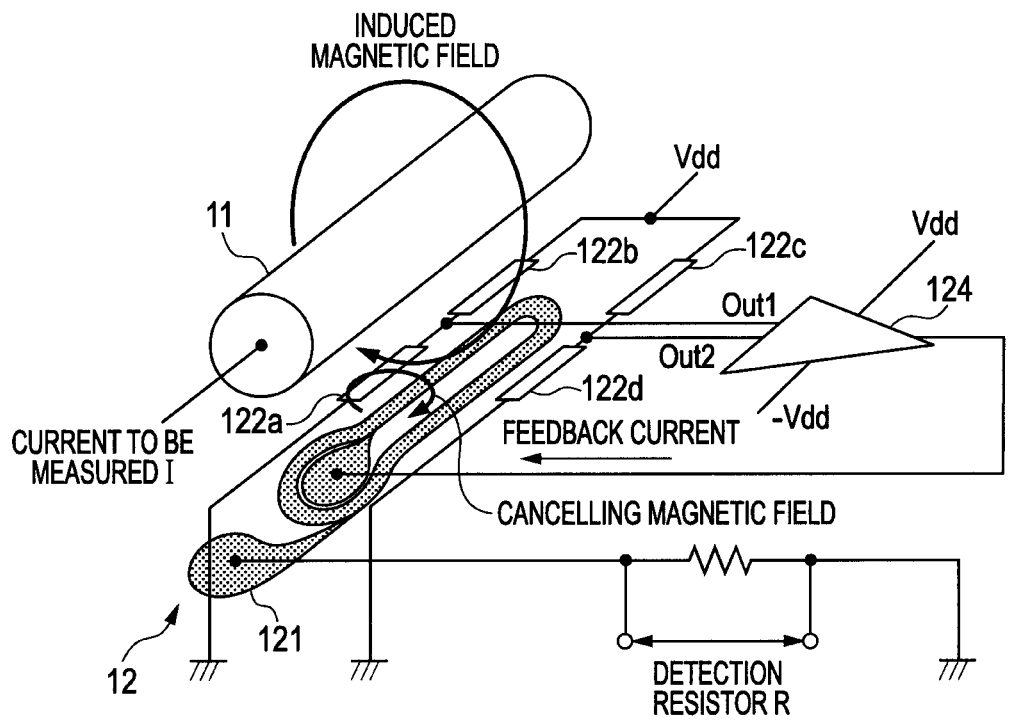
FIG. 1 is a diagram illustrating a magnetic balance current sensor according to an embodiment of the present invention.
Figure 2:
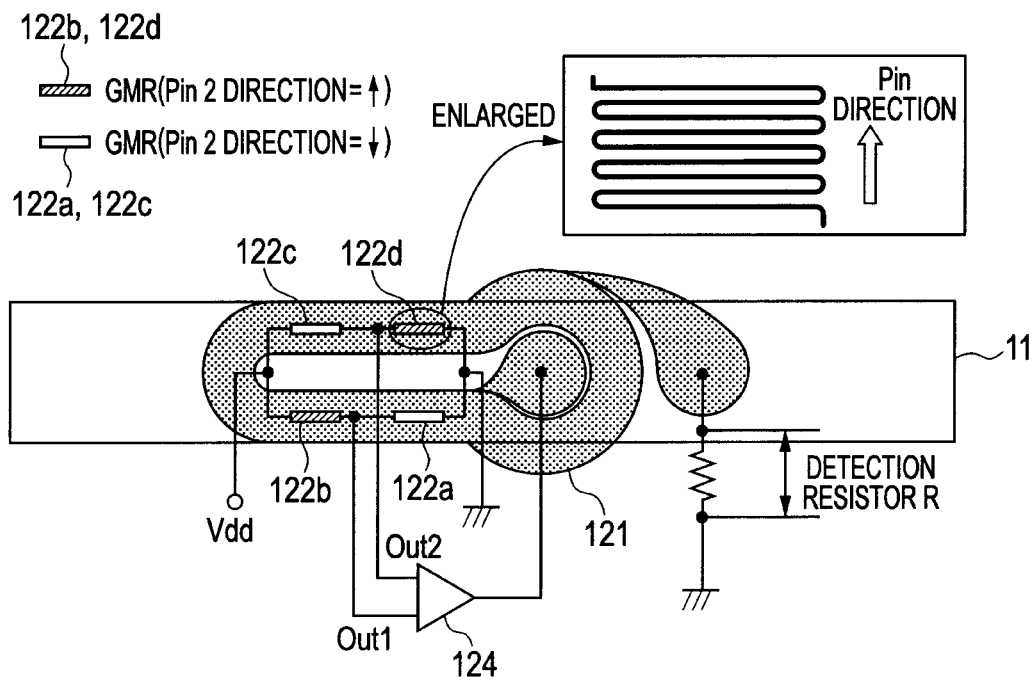
FIG. 2 is a diagram illustrating a magnetic balance current sensor according to an embodiment of the present invention.

FIGS. 1 and 2 are diagrams illustrating a magnetic balance current sensor according to an embodiment of the present invention. The magnetic balance current sensor shown in FIGS. 1 and 2 is installed adjacent to a conductor 11 through which a current I to be measured flows. The magnetic balance current sensor includes a feedback circuit 12 for inducing a magnetic field (cancelling magnetic field) for cancelling an induced magnetic field generated from the current I to be measured which flows in the conductor 11. The feedback circuit 12 has a feedback coil 121 wound in a direction for cancelling a magnetic field generated from the current I to be measured, and four magneto-resistance effect elements 122a to 122d.

The feedback coil 121 is constituted of a planar coil. Since the configuration does not have a magnetic core, the feedback coil can be made at low cost. In addition, as compared with a case of a toroidal coil, it is possible to prevent the cancelling magnetic field, which is generated from the feedback coil, from extensively spreading, and to prevent it from impacting on peripheral circuits. In addition, as compared with the case of the toroidal coil, if the current to be measured is an alternating current, the control of the cancelling magnetic field by the feedback coil is easy, and a current flowing for the control is not particularly increased. These effects become greater as the current to be measured, which is an alternating current, becomes a high frequency. In the case where the feedback coil 121 is constituted of the planar coil, it is desirable that the planar coil is provided such that both the induced magnetic field and the cancelling magnetic field are generated in a plane which is parallel with a forming surface of the planar coil.

The resistance values of the magneto-resistance effect elements 122a to 122d are varied by application of the induced magnetic field from the current I to be measured. The four magneto-resistance effect elements 122a to 122d constitute a magnetic detecting bridge circuit. A magnetic balance current sensor with high sensitivity can be achieved by using the magnetic detecting bridge circuit having the magneto-resistance effect elements.

The magnetic detecting bridge circuit has two outputs for inducing a voltage difference in accordance with the induced magnetic field generated by the current I to be measured. In the magnetic detecting bridge circuit shown in FIG. 2, a power source Vdd is connected to a connection point between the magneto-resistance effect element 122b and the magneto-resistance effect element 122c, and a ground (GND) is connected to a connection point between the magneto-resistance effect element 122a and the magneto-resistance effect element 122d. In addition, in the magnetic detecting bridge circuit, one output (Out1) is taken from the connection point between the magneto-resistance effect elements 122a and 122b, and the other output (Out2) is taken from the connection point between magneto-resistance effect elements 122c and 122d. The two outputs are amplified by an amplifier 124, and then are applied to the feedback coil 121 as a current (feedback current). The feedback current corresponds to a voltage difference in accordance with the induced magnetic field. At that time, the cancelling magnetic field for cancelling the induced magnetic field is generated from the feedback coil 121. The current to be measured is measured by a detection unit (detection resistor R) based on the current flowing in the feedback coil 121 at the time of an equilibrium state in which the induced magnetic field and the cancelling magnetic field are cancelled.

Figure 3:
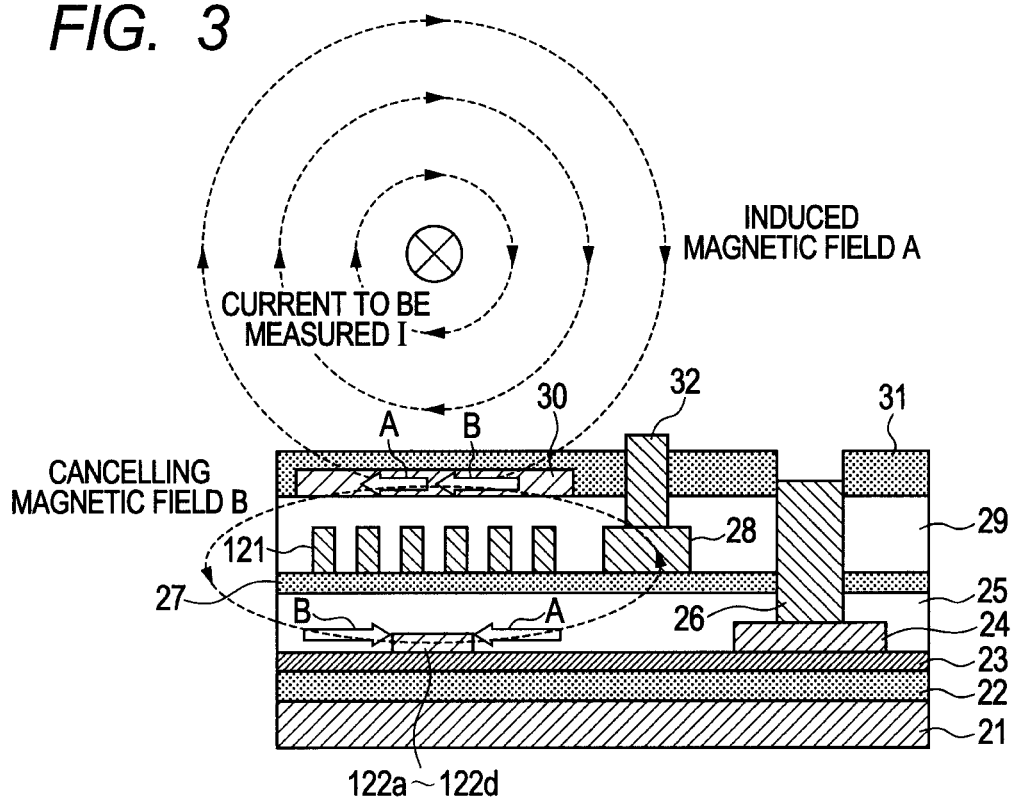
FIG. 3 is a cross-sectional view illustrating a magnetic balance current sensor shown in FIG. 1.

FIG. 3 is a cross-sectional view illustrating the magnetic balance current sensor shown in FIG. 1. As shown in FIG. 3, in the magnetic balance current sensor according to the embodiment, the feedback coil, the magnetic shield, and the magnetic detecting bridge circuit are formed on the same substrate 21. In the configuration shown in FIG. 3, the feedback coil is placed between the magnetic shield and the magnetic detecting bridge circuit, and the magnetic shield is placed at a side near to the current I to be measured. That is, the magnetic shield, the feedback coil, and the magneto-resistance effect element are placed in order from the side near the conductor 11. In this way, the magneto-resistance effect element can be the farthest away from the conductor 11, and the induced magnetic field applied to the magneto-resistance effect element from the current I to be measured can be reduced. Further, since the magnetic shield can be the nearest the conductor 11, the attenuation effect of the induced magnetic field can be further improved. Accordingly, the cancelling magnetic field from the feedback coil can be reduced.

The layer configuration shown in FIG. 3 will be described in detail. In the magnetic balance current sensor shown in FIG. 3, a thermal silicon oxide film 22 serving as an insulating layer is formed on the substrate 21. An aluminum oxide film 23 is formed on the thermal silicon oxide film 22. For example, the aluminum oxide film 23 can be formed as a film by a method such as sputtering or the like. In addition, a silicon substrate or the like is used as the substrate 21.

The magneto-resistance effect elements 122a to 122d are formed on the aluminum oxide film 23 to form a magnetic detecting bridge circuit. As the magneto-resistance effect elements 122a to 122d, a TMR element (tunnel magneto-resistance effect element), a GMR element (giant magneto-resistance effect element), or the like can be used. The film configuration of the magneto-resistance effect element for using in the magnetic balance current sensor according to the present invention will be described below.

As the magneto-resistance effect element, a GMR element having a meandering shape is desirable, as shown in the enlarged view of FIG. 2, in which a plurality of belt-like elongated patterns (stripes) are placed in such a way that longitudinal directions thereof are parallel with each other by being folded back. In the meandering shape, a sensitivity axis direction (Pin direction) is a direction (widthwise direction of the stripes) perpendicular to the longitudinal direction (longitudinal direction of the stripes) of the elongated pattern. In the meandering shape, the induced magnetic field and the cancelling magnetic field are applied in the direction perpendicular to a longitudinal direction of the stripe.

Considering the linearity in the meandering shape, it is desirable that the width of the meandering shape in a Pin direction is 1 μm to 10 μm. In this instance, considering the linearity, it is desirable that the longitudinal direction is perpendicular to the direction of the induced magnetic field and the direction of the cancelling magnetic field. With the meandering shape, it is possible to achieve the output of the magneto-resistance effect element with fewer terminals (two terminals) than Hall elements.

In addition, an electrode 24 is formed on the aluminum oxide layer 23. The electrode 24 may be formed by photolithography and etching after an electrode material is formed as a film.

On the aluminum oxide layer 23 formed with the magneto-resistance effect elements 122a to 122d and the electrode 24, a polyimide layer 25 is formed as an insulating layer. The polyimide layer 25 may be formed by applying and curing a polyimide material.

A silicon oxide film 27 is formed on the polyimide layer 25. The silicon oxide film 27 is formed as a film by, for example, sputtering or the like.

The feedback coil 121 is formed on the silicon oxide film 27. The feedback coil 121 may be formed by photolithography and etching after a coil material is formed as a film. Alternatively, the feedback coil 121 may be formed by photolithography and plating after a base material is formed as a film.

In addition, a coil electrode 28 is formed on the silicon oxide film 27 in the vicinity of the feedback coil 121. The coil electrode 28 may be formed by photolithography and etching after an electrode material is formed as a film.

On the silicon oxide layer 27 formed with the feedback coil 121 and the coil electrode 28, a polyimide layer 29 is formed as an insulating layer. The polyimide layer 29 may be formed by applying and curing a polyimide material.

A magnetic shield 30 is formed on the polyimide layer 29. The configuration material of the magnetic shield 30 can use a high permeability material such as an amorphous magnetic material, a permalloy-based magnetic material, or an iron-based microcrystalline material.

A silicon oxide layer 31 is formed on the polyimide layer 29. The silicon oxide layer 31 may be formed as a film by a method such as, for example, sputtering. Contact holes are formed in predetermined regions of the polyimide layer 29 and the silicon oxide layer 31 (a region of the coil electrode 28 and a region of the electrode 24), and electrode pads 32 and 26 are formed in the contact holes. The contact holes are formed by photolithography and etching. The electrode pads 32 and 26 may be formed by photolithography and plating after the electrode material is formed as a film.

In the magnetic balance current sensor including the above-described configuration, as shown in FIG. 3, the magneto-resistance effect element receives the induced magnetic field A generated from the current I to be measured, and then the induced magnetic field is fed back to generate the cancelling magnetic field B from the feedback coil 121. Two magnetic fields (the induced magnetic field A and the cancelling magnetic field B) are appropriately adjusted in such a way that the magnetic fields are cancelled to let a magnetic field applied to the magneto-resistance effect elements 122a to 122d be zero.

The magnetic balance current sensor according to the present invention includes the magnetic shield 30 in the vicinity of the feedback coil 121, as shown in FIG. 3. The magnetic shield 30 can attenuate the induced magnetic field generated from the current I to be measured and applied to the magneto-resistance effect elements 122a to 122d (the direction of the induced magnetic field A and the direction of the cancelling magnetic field B are opposite directions in the magneto-resistance effect elements 122a to 122d), and enhance the cancelling magnetic field B from the feedback coil 121 (the direction of the induced magnetic field A and the direction of the cancelling magnetic field B are the same direction in the magnetic shield 30). Accordingly, since the magnetic shield 30 functions as a magnetic yoke, the current flowing in the feedback coil 121 can be reduced, and thus reduced power consumption can be achieved. In addition, the effect of the external magnetic field can be reduced by the magnetic shield 30.

The magnetic balance current sensor including the above-described configuration utilizes the magneto-resistance effect element as the magnetic detecting element, in particular, the magnetic detecting bridge circuit having the GMR element or the TMR element, so that a magnetic balance current sensor having high sensitivity can be achieved. In addition, in the magnetic balance current sensor, the magnetic detecting bridge circuit is constituted of four magneto-resistance effect elements with the same film configuration. Further, in the magnetic balance current sensor including the above-described configuration, since the feedback coil 121, the magnetic shield 30, and the magnetic field detecting bridge are formed on the same substrate, the miniaturization thereof can be achieved. Moreover, since the magnetic balance current sensor does not include the magnetic core, miniaturization and cost reduction can be achieved.

Figure 10A:
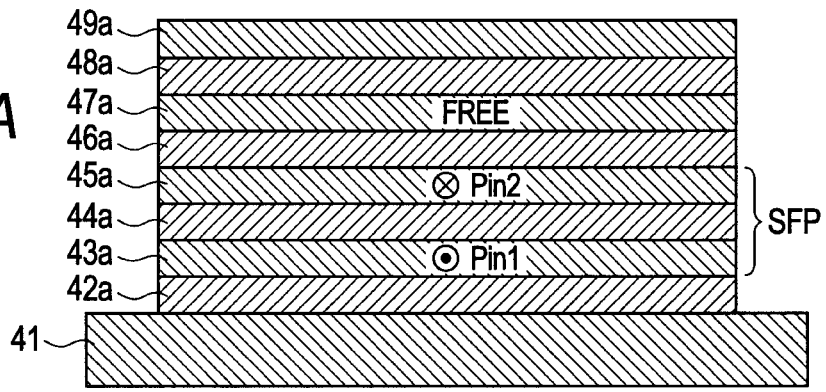
FIGS. 10A to 10C are diagrams illustrating a method of manufacturing a magneto-resistance effect element in a current sensor according to an embodiment of the present invention.

The film configuration of the magneto-resistance effect element used in the present invention is shown, for example, in FIG. 10A. That is, the magneto-resistance effect element includes the laminate structure provided on the substrate 41, as shown in FIG. 10A. In addition, as shown in FIG. 10A, other than the magneto-resistance effect element, a base layer or the like is not shown on the substrate 41, in order to facilitate the description. The magneto-resistance effect element includes a seed layer 42a, a first ferromagnetic film 43a, an antiparallel coupling film 44a, a second ferromagnetic film 45a, a non-magnetic intermediate layer 46a, soft magnetic free layers (free magnetic layer) 47a and 48a, and a protective layer 49a.

The seed layer 42a is made of NiFeCr, Cr or the like. The protective layer 49a is made of Ta or the like. In addition, in the laminate structure, a base layer made of a nonmagnetic material, such as any one element of, for example, Ta, Hf, Nb, Zr, Ti, Mo, and W, may be provided between the substrate 41 and the seed layer 42a.

In the magneto-resistance effect element, the first ferromagnetic film 43a and the second ferromagnetic film 45a are coupled in an antiferromagnetic manner via the antiparallel coupling film 44a therebetween, thereby forming a so-called ferromagnetic fixed layer (SFP: Synthetic Ferri Pinned layer) of a self-pinned type.

In the ferromagnetic fixed layer, as the thickness of the antiparallel coupling film 44a is set to 0.3 nm to 0.45 nm, or 0.75 nm to 0.95 nm, a strong antiferromagnetic coupling is achieved between the first ferromagnetic film 43a and the second ferromagnetic film 45a.

In addition, the magnetization amount (Ms·t) of the first ferromagnetic film 43a and the magnetization amount (Ms·t) of the second ferromagnetic film 45a are substantially equal to each other. That is, the difference in the magnetization amount between the first ferromagnetic film 43a and the second ferromagnetic film 45a is substantially zero. For this reason, the effective anisotropic magnetic field of the SFP layer is large. Accordingly, even though the antiferromagnetic material is not used, magnetization stability of the ferromagnetic fixed layer (Pinned layer) can be sufficiently ensured. Supposing that the film thickness of the first ferromagnetic film is t1, the film thickness of the second ferromagnetic film is t2, and magnetization and induced magnetic anisotropic constants per unit volume of both layers are Ms and K, the effective anisotropic magnetic field of the SFP layer is represented by Equation 1 below:

$$\text{eff } HK = 2(K \cdot t1 + K \cdot t2)/(Ms \cdot t1 - Ms \cdot t2) \qquad \text{Equation 1}$$

Accordingly, the magneto-resistance effect element used in the magnetic balance current sensor according to the present invention includes a layer structure with no antiferromagnetic layer.

A Curie temperature (Tc) of the first ferromagnetic film 43a and a Curie temperature (Tc) of the second ferromagnetic film 45a are substantially equal to each other. In this way, the difference in the magnetization amounts (Ms·t) of the two films 43a and 45a under a hot environment becomes zero, and thus the high magnetization stability can be maintained.

It is desirable that the first ferromagnetic film 43a is made of a CoFe alloy containing Fe of 40 atomic percent to 80 atomic percent. The reason is that the CoFe alloy of the composition range has a high coercive force, and maintains the magnetization reliably with respect to the external magnetic field. In addition, it is desirable that the second ferromagnetic film 45a is made of a CoFe alloy containing Fe of 0 atomic percent to 40 atomic percent. The reason is that the CoFe alloy of the composition range has a low coercive force, and is easily magnetized in an antiparallel direction (180° different direction) with respect to a preferential magnetization direction of the first ferromagnetic film 43a. As a result, it is possible to further increase Hk. In addition, by limiting the second ferromagnetic film 45a in this composition range, the resistance change rate of the magneto-resistance effect element can be increased.

It is desirable that during film formation, a magnetic field is applied to the first ferromagnetic film 43a and the second ferromagnetic film 45a in the widthwise direction of stripes of the meandering shape, and after film formation, the induced magnetic anisotropy is applied to the first ferromagnetic film 43a and the second ferromagnetic film 45a. In this way, both the first ferromagnetic film 43a and the second ferromagnetic film 45a are magnetized antiparallel to the widthwise direction of the stripes. In addition, since the magnetization direction of the first ferromagnetic film 43a and the second ferromagnetic film 45a is determined by the applying direction of the magnetic field at the time of film formation of the first ferromagnetic film 43a, it is possible to form the plurality of magneto-resistance effect elements having the ferromagnetic fixed layer of different magnetization direction on the same substrate by changing the applying direction of the magnetic field at the time of film formation of the first ferromagnetic film 43a.

The antiparallel coupling film 44a of the ferromagnetic fixed layer is made of Ru or the like. In addition, the soft magnetic free layers (free layer) 47a and 48a are made of a magnetic material such as a CoFe alloy, a NiFe alloy, a CoFeNi alloy or the like. Further, the nonmagnetic intermediate layer 46a is made of Cu or the like. Moreover, it is desirable that during film formation, a magnetic field is applied to the soft magnetic free layers 47a and 48a in the widthwise direction of the stripes of the meandering shape, and after film formation, the induced magnetic anisotropy is applied to the soft magnetic free layers 47a and 48a. In this way, in the magneto-resistance effect element, the resistance is linearly changed with respect to an external magnetic field (magnetic field from the current to be measured) of the widthwise direction of the stripes, so that hysteresis can be reduced. The magneto-resistance effect element includes a spin valve configuration with the ferromagnetic fixed layer, the nonmagnetic intermediate layer, and the soft magnetic free layer.

An example of the film configuration of the magneto-resistance effect element for use in the magnetic balance current sensor according to the present invention includes, for example, NiFeCr (seed layer: 5 nm), Fe70Co30 (first ferromagnetic film: 1.65 nm), Ru (antiparallel coupling film: 0.4 nm), Co90Fe10 (second ferromagnetic film: 2 nm), Cu (nonmagnetic intermediate layer: 2.2 nm), Co90Fe10 (soft magnetic free layer: 1 nm), NiFe (soft magnetic free layer: 7 nm), and Ta (protective layer: 5 nm).

Figure 4:
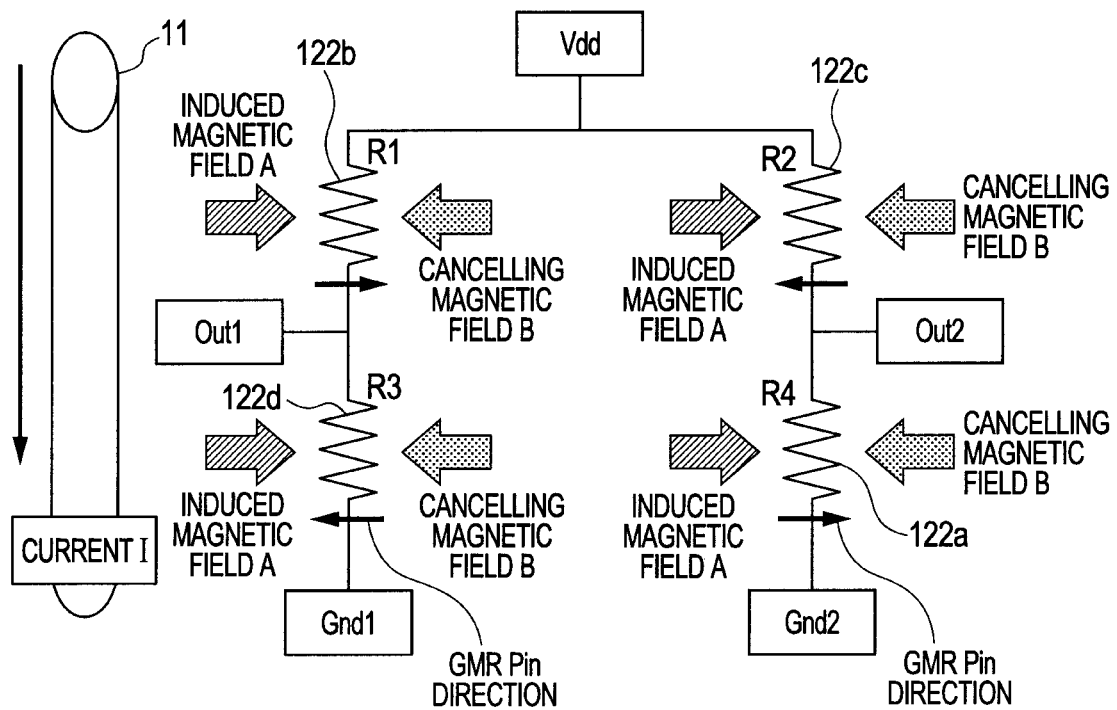
FIG. 4 is a diagram illustrating a magnetic detecting bridge circuit in a magnetic balance current sensor according to an embodiment of the present invention.

In the magnetic balance current sensor according to the present invention, as shown in FIG. 4, the magnetization directions (magnetization direction of the second ferromagnetic film: Pin2) of two magneto-resistance effect elements 122b and 122d outputting the midpoint potential (Out1) are different from each other by 180° (antiparallel), and the magnetization directions (magnetization direction of the second ferromagnetic film: Pin2) of two magneto-resistance effect elements 122a and 122c outputting the midpoint potential (Out2) are different from each other by 180° (antiparallel). In addition, the resistance change rate of the four magneto-resistance effect elements 122a to 122d is equal to each other. In a case where the angle of the magnetic field applied to the ferromagnetic fixed layer is equal, it is desirable that the magneto-resistance effect elements 122a to 122d represent the same resistance change rate at the same magnetic strength.

In the magnetic balance current sensor including the four magneto-resistance effect elements 122a to 122d placed as described above, the current to be measured is measured by applying the cancelling magnetic field to the magneto-resistance effect element from the feedback coil 121 so that the voltage difference between two outputs Out1 and Out2 of the magnetic detecting bridge circuit becomes zero, and detecting the value of the current flowing in the feedback coil 121 at that time. At this time, among the four magneto-resistance effect elements 122a to 122d, the magneto-resistance effect elements 122a and 122b serve as the magneto-resistance effect element, and the magneto-resistance effect elements 122c and 122d serve as the fixed resistance element.

As shown in FIG. 4, if the current I to be measured flows in the direction of the arrow, the induced magnetic field A and the cancelling magnetic field B are respectively applied to the four magneto-resistance effect elements 122a to 122d. At that time, when the composite magnetic field strength of the induced magnetic field and the cancelling magnetic field generated from the current to be measured becomes zero, the midpoint potential difference of the magnetic detecting bridge circuit becomes zero.

In the magnetic detecting bridge circuit, the resistance values of the magneto-resistance effect elements 122a to 122d in a zero magnetic field are equal to each other (Rcom). In addition, the resistance change rates of the magneto-resistance effect elements 122a to 122d are equal to each other. The output between the magneto-resistance effect elements 122b and 122d is set to Out1, and the output between the magneto-resistance effect elements 122a and 122c is set to Out2. Moreover, a resistance value of the magneto-resistance effect element 122b is set to R1, a resistance value of the magneto-resistance effect element 122c is set to R2, a resistance value of the magneto-resistance effect element 122d is set to R3, and a resistance value of the magneto-resistance effect element 122a is set to R4.

When the resistance change amount of the magneto-resistance effect elements 122a to 122d according to the induced magnetic field generated from the current I to be measured is ΔR, a midpoint potential difference (Out1 and Out2) of the bridge is obtained as follows:

Resistance between $Vdd$ and $Gnd1 =$ $$(R1 - \Delta R) + (R3 + \Delta R) = R1 + R3 = 2 \times R_{com}$$

Resistance between $Vdd$ and $Gnd2 =$ $$(R2 + \Delta R) + (R4 - \Delta R) = R2 + R4 = 2 \times R_{com}$$

Potential of $Out1 =$ $$(R3 + \Delta R)/(R1 + R3) \times Vdd = (R_{com} + \Delta R)/(2 \times R_{com}) \times Vdd$$

Potential of $Out2 =$ $$(R4 - \Delta R)/(R2 + R4) \times Vdd = (R_{com} - \Delta R)/(2 \times R_{com}) \times Vdd$$

Potential difference between $Out1$ and $Out2 =$ $$(2 \times \Delta R)/(2 \times R_{com}) \times Vdd = \Delta R/R_{com} \times Vdd$$

As described above, in the magnetic balance current sensor according to the present invention, a term ΔR is not contained in a denominator in the equation of the midpoint potential difference of the bridge. For this reason, the output of the midpoint potential difference is varied in proportion to the induced magnetic field which is generated by the current I to be measured. As a result, it is possible to carry out the current measurement with a high degree of accuracy.

Figure 5A:
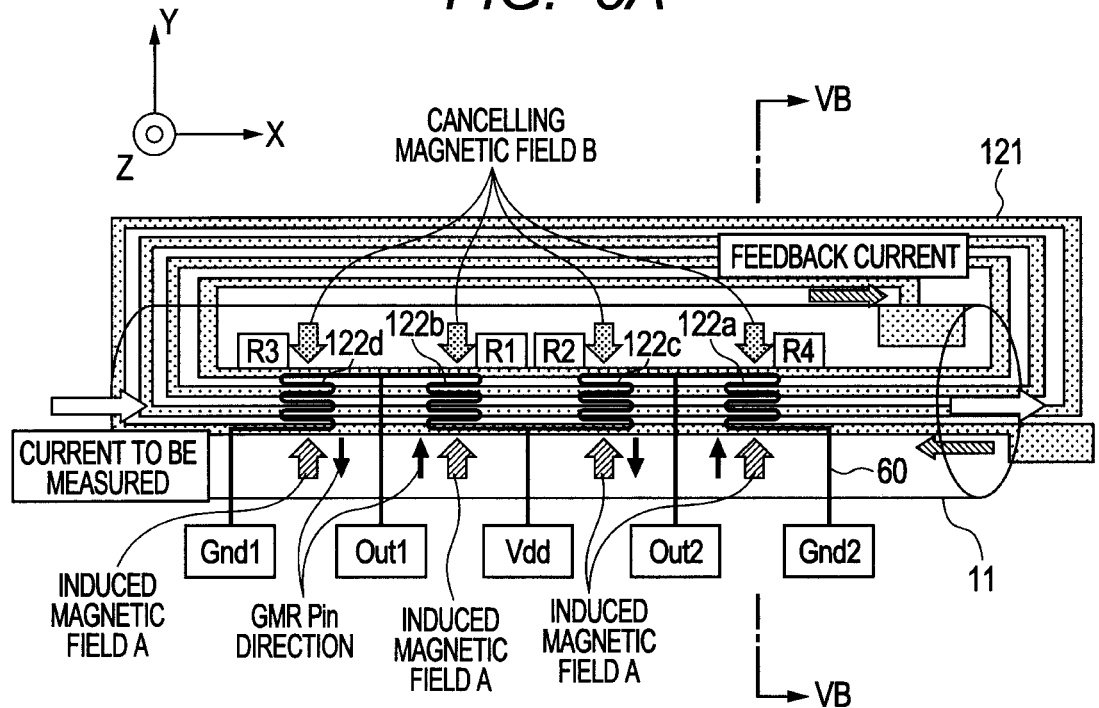
FIG. 5A is a diagram illustrating a wiring pattern of a magnetic detecting bridge circuit in a magnetic balance current sensor according to an embodiment of the present invention.
Figure 5B:
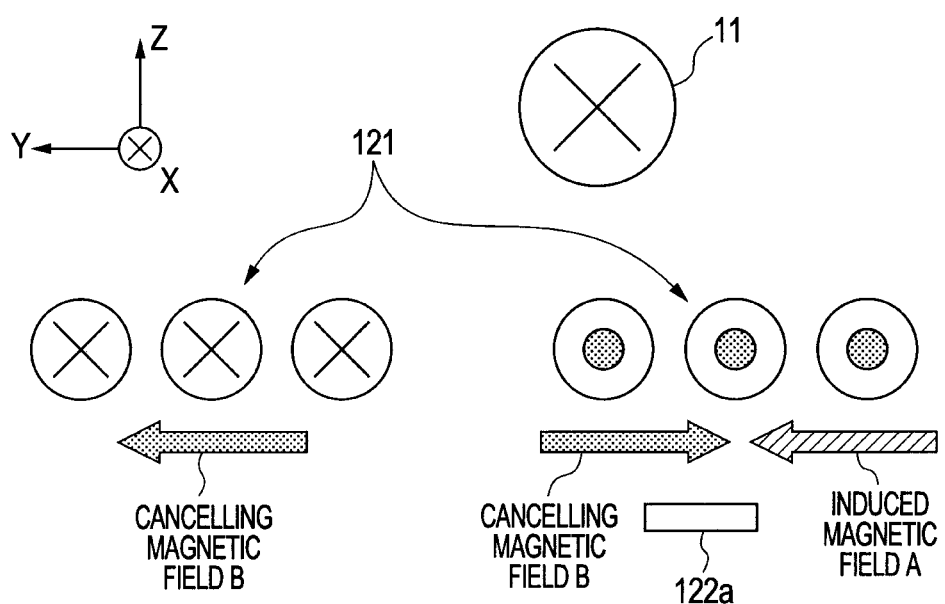
FIG. 5B is a cross-sectional view taken along the line VB-VB in FIG. 5A.

FIG. 5A is a diagram illustrating a wiring pattern of the magnetic detecting bridge circuit in the magnetic balance current sensor according to an embodiment of the present invention. FIG. 5B is a cross-sectional view taken along the line VB-VB in FIG. 5A. The magnetic detecting bridge circuit of the magnetic balance current sensor according to the present invention includes wiring symmetrical to a power supply point, as shown in FIG. 5A. The magneto-resistance effect elements 122a to 122d are formed in the extending direction (conduction direction of the feedback current) of the coil pattern of the feedback coil 121 and the stripe longitudinal direction of meandering shape thereof, as shown in FIG. 5A. The feedback coil is installed on the magneto-resistance effect element, as shown in FIG. 5B.

In addition, a wiring pattern 60 is formed to be connected to the magneto-resistance effect elements 122a to 122d and a power supply point (Vdd) or Gnd. The wiring pattern 60 is symmetrical to the power supply point. In this way, since the lengths of the wiring at both sides of the power supply point are substantially equal to each other, there is no difference in the wiring resistances at both sides of the power supply point. As a result, since there is no misalignment of the midpoint potential caused by the difference in wiring resistances, it is possible to carry out the current measurement with a high degree of accuracy.

Figure 6A:
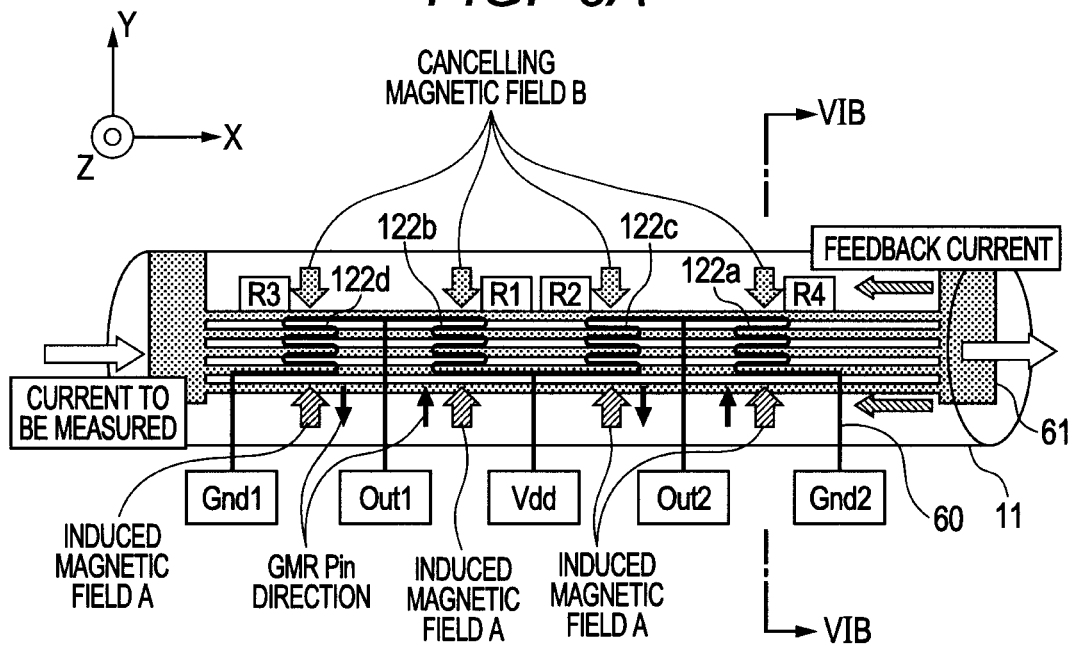
FIG. 6A is a diagram illustrating a wiring pattern of a magnetic detecting bridge circuit in a magnetic balance current sensor according to an embodiment of the present invention.
Figure 6B:
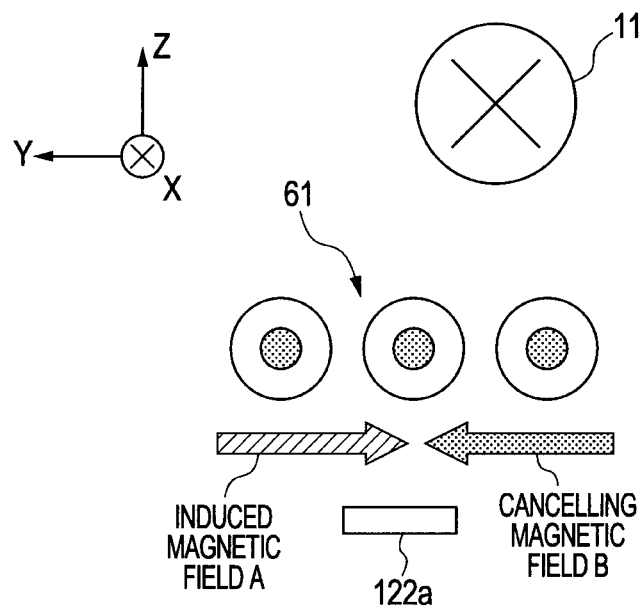
FIG. 6B is a cross-sectional view taken along the line VIB-VIB in FIG. 6A.

FIG. 6A is a diagram illustrating a wiring pattern of the magnetic detecting bridge circuit in the magnetic balance current sensor according to an embodiment of the present invention. FIG. 6B is a cross-sectional view taken along the line VIB-VIB in FIG. 6A. The magnetic detecting bridge circuit of the magnetic balance current sensor according to the present invention includes wiring symmetrical to a power supply point, as shown in FIG. 6A. The magneto-resistance effect elements 122a to 122d are formed in the extending direction (conduction direction of the feedback current) of a spiral pattern 61 of the feedback coil 121 and the longitudinal direction of the stripes of the meandering shape thereof, as shown in FIG. 6A. The spiral pattern 61 of the feedback coil 121 is installed on the magneto-resistance effect element, as shown in FIG. 6B.

In addition, a wiring pattern 60 is formed to be connected to the magneto-resistance effect elements 122a to 122d and a power supply point (Vdd) or Gnd. The wiring pattern 60 is symmetrical to the power supply point. In this way, since the lengths of the wiring at both sides of the power supply point are substantially equal to each other, there is no difference in the wiring resistances at both sides of the power supply point. As a result, since there is no misalignment of the midpoint potential caused by the difference in wiring resistances, it is possible to carry out the current measurement with a high degree of accuracy. Further, since a region with no magneto-resistance effect element can be omitted in the feedback coil 121 by using the spiral pattern 61, it is possible to decrease the area of the feedback coil.

Figure 7A:
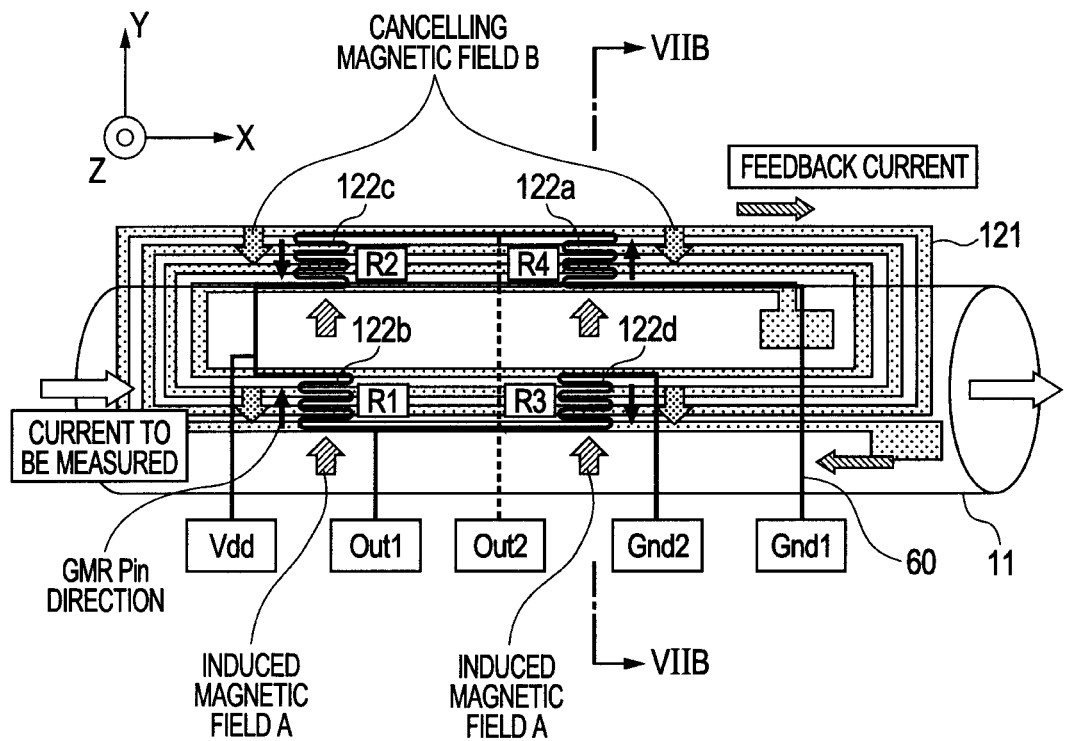
FIG. 7A is a diagram illustrating a wiring pattern of a magnetic detecting bridge circuit in a magnetic balance current sensor according to an embodiment of the present invention.
Figure 7B:
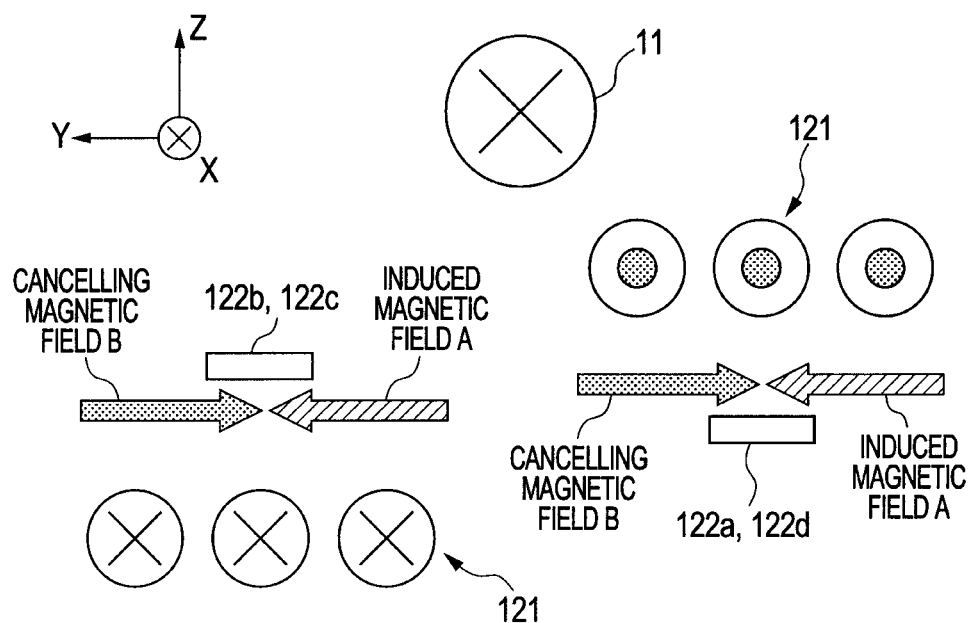
FIG. 7B is a cross-sectional view taken along the line VIIB-VIIB in FIG. 7A.

FIG. 7A is a diagram illustrating a wiring pattern of a magnetic detecting bridge circuit in the magnetic balance current sensor according to an embodiment of the present invention. FIG. 7B is a cross-sectional view taken along the line VIIB-VIIB in FIG. 7A. The magnetic detecting bridge circuit of the magnetic balance current sensor according to the present invention includes wiring symmetrical to a power supply point, as shown in FIG. 7A. The magneto-resistance effect elements 122a to 122d are formed in the extending direction (conduction direction of the feedback current) of the feedback coil 121 and the longitudinal direction of the stripes of the meandering shape thereof, as shown in FIG. 7A. The feedback coil 121 is installed on two magneto-resistance effect elements 122a and 122d, and the feedback coil 121 is installed below two magneto-resistance effect elements 122b and 122c, as shown in FIG. 7B.

In addition, a wiring pattern 60 is formed to be connected to the magneto-resistance effect elements 122a to 122d and a power supply point (Vdd) or Gnd. The wiring pattern 60 is symmetrical to the power supply point. In this way, since the lengths of the wiring at both sides of the power supply point are substantially equal to each other, there is no difference in the wiring resistances at both sides of the power supply point. As a result, since there is no misalignment of the midpoint potential caused by the difference in wiring resistances, it is possible to carry out the current measurement with a high degree of accuracy. Further, by using the coil pattern shown in FIG. 7, four magneto-resistance effect elements are not arranged in parallel, but two magneto-resistance effect elements are arranged in parallel, so that the magneto-resistance effect element can be provided in two extending regions of the feedback coil 121. As a result, it is possible to shorten the length of the magnetic detecting bridge circuit in the widthwise direction (conduction direction of the feedback current).

The magnetic balance current sensor using the four magneto-resistance effect elements can also be made using a type of magneto-resistance effect element which fixes the magnetization of a fixed magnetic layer as an antiferromagnetic film. In this instance, in order to make the exchange coupling direction of a fixed magnetic layer (Pinned layer) which is one of two magneto-resistance effect elements be antiparallel to the exchange coupling direction of the fixed magnetic layer of the other, it is necessary to apply laser lock annealing or install a magnetic field applying coil adjacent to the magneto-resistance effect element. Such a method can be applied to a case where the magneto-resistance effect element manufactures a sensor or device positioned near a topmost surface of a chip, but it cannot be applied to the manufacture of a device with a thick organic insulating film, a thick feedback coil, or a thick magnetic shield film provided on the magneto-resistance effect element, like the magnetic balance current sensor according to the present invention. For this reason, the configuration of the present invention is particularly useful for the magnetic balance current sensor according to the present invention.

In the case where the magnetic detecting bridge circuit and the feedback coil are integrally formed on the same substrate, like the magnetic balance current sensor according to the present invention, since both of them should be completely insulated from each other, both the magnetic detecting bridge circuit and the feedback coil are separated by an organic insulating film such as polyimide film. The organic insulating film is generally formed by applying it with a spin coater or the like, and then heating it at 200° C. or more. Since the organic insulating film is formed during a subsequent process of forming the magnetic detecting bridge circuit, the magneto-resistance effect element is also heated. In the process of manufacturing a type of magneto-resistance effect element which fixes the magnetization of the fixed magnetic layer as an antiferromagnetic film, it is necessary to perform heating while applying the magnetic field, so as not to deteriorate the characteristics of the fixed magnetic layer due to thermal hysteresis at the process of forming the organic insulating film. In the magnetic balance current sensor according to the present invention, since the antiferromagnetic film is not used, it is possible to maintain the characteristics of the fixed magnetic layer, even without carrying out a heating process while applying the magnetic field. Accordingly, the deterioration in hysteresis of the soft magnetic free layer can be suppressed.

In addition, since the magneto-resistance effect element of the magnetic balance current sensor according to the present invention does not contain an antiferromagnetic material, it is possible to suppress a material cost or manufacturing cost.

Figure 8:
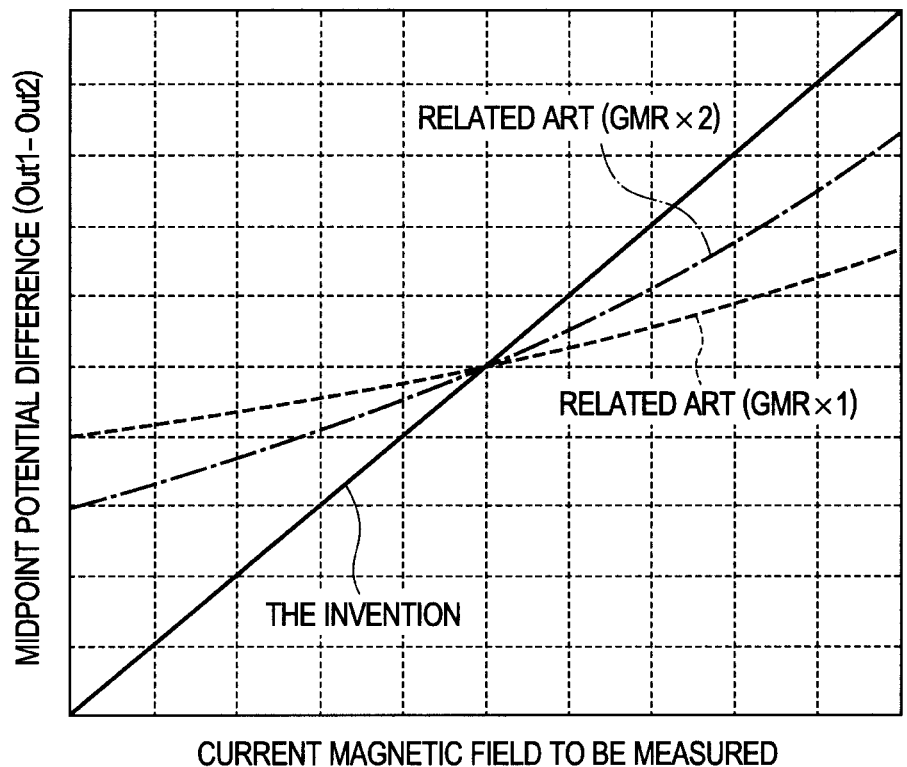
FIG. 8 is a diagram illustrating a relationship between a midpoint potential difference and an induced magnetic field generated from a current to be measured.
Figure 16:
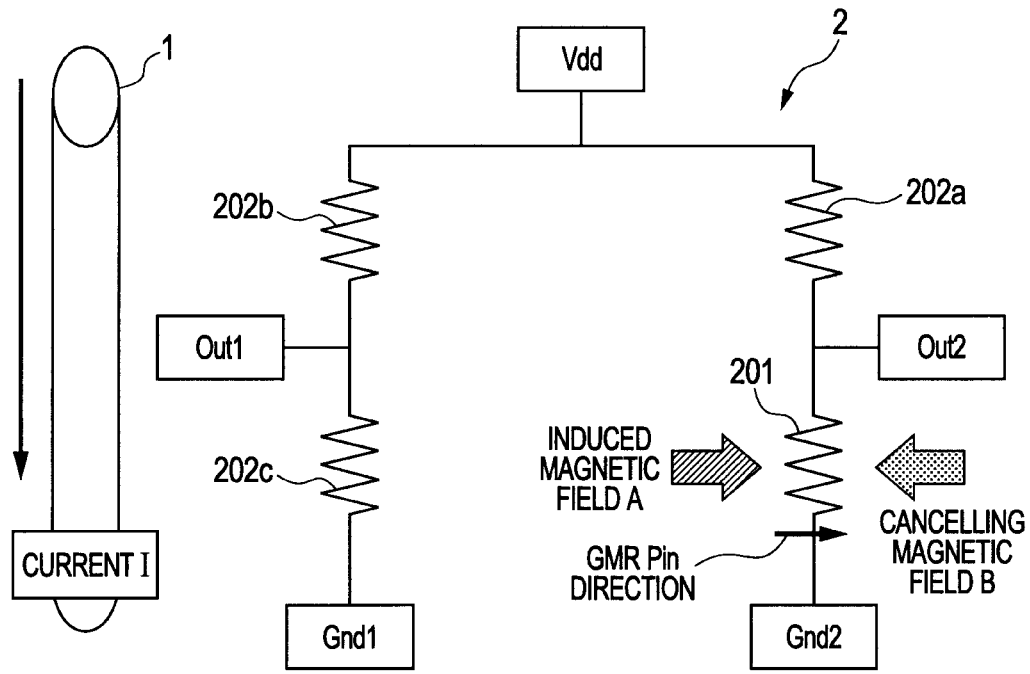
FIG. 16 is a diagram illustrating a magnetic detecting bridge circuit in a magnetic balance current sensor according to the related art.
Figure 17:
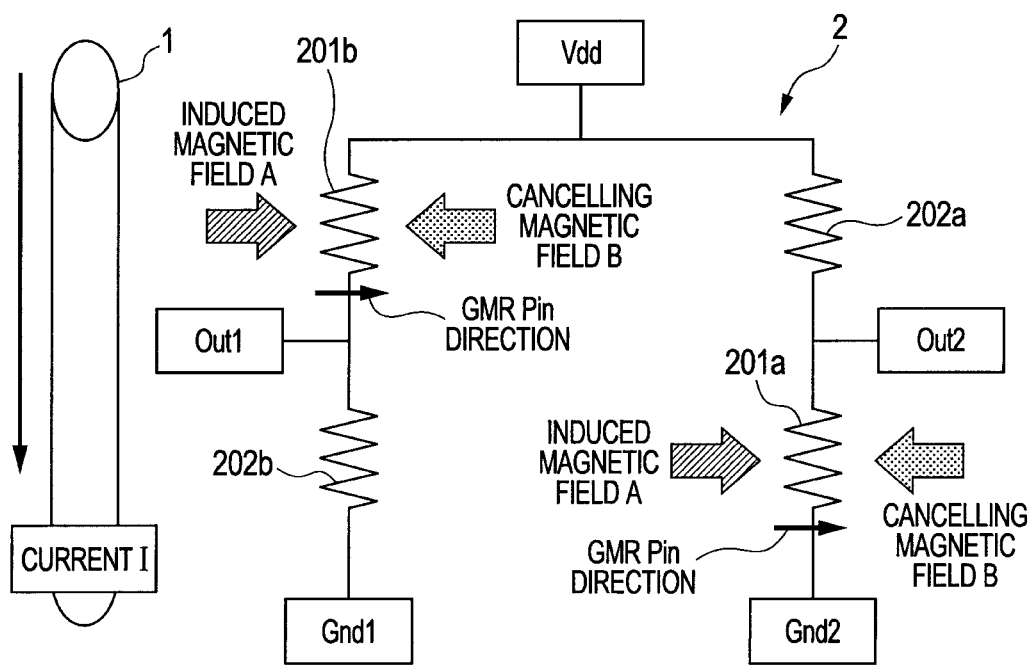
FIG. 17 is a diagram illustrating a magnetic detecting bridge circuit in a magnetic balance current sensor according to the related art.

An embodiment for clearly explaining the effects of the present invention will be described. A relationship between the induced magnetic field (magnetic field of the current to be measured) generated from the current to be measured and the midpoint potential difference of the magnetic detecting bridge circuit was tested on the magnetic balance current sensor having the magnetic detecting bridge circuit shown in FIG. 4. The result is shown in FIG. 8. In addition, a relationship between the induced magnetic field (magnetic field of the current to be measured) generated from the current to be measured and the midpoint potential difference of the magnetic detecting bridge circuit was also tested on the magnetic balance current sensor (the related art (GMRx1)) having the magnetic detecting bridge circuit shown in FIG. 16, and the magnetic balance current sensor (the related art (GMRx2)) having the magnetic detecting bridge circuit shown in FIG. 17. The result is shown in FIG. 8.

As can be seen from FIG. 8, as the midpoint potential difference is changed in the shape of a straight line with respect to the induced magnetic field generated from the current to be measured, the magnetic balance current sensor (the invention) according to the present invention can carry out the current measurement with a high degree of accuracy. In particular, since the four magneto-resistance effect elements are used, it is possible to achieve a current sensor with high sensitivity. Meanwhile, as the midpoint potential difference is changed in the shape of a curved line with respect to the induced magnetic field generated from the current to be measured, the magnetic balance current sensors (the related art (GMRx1) and the related art (GMRx2)) according to the related arts cannot carry out the current measurement with a high degree of accuracy.

Figure 9:
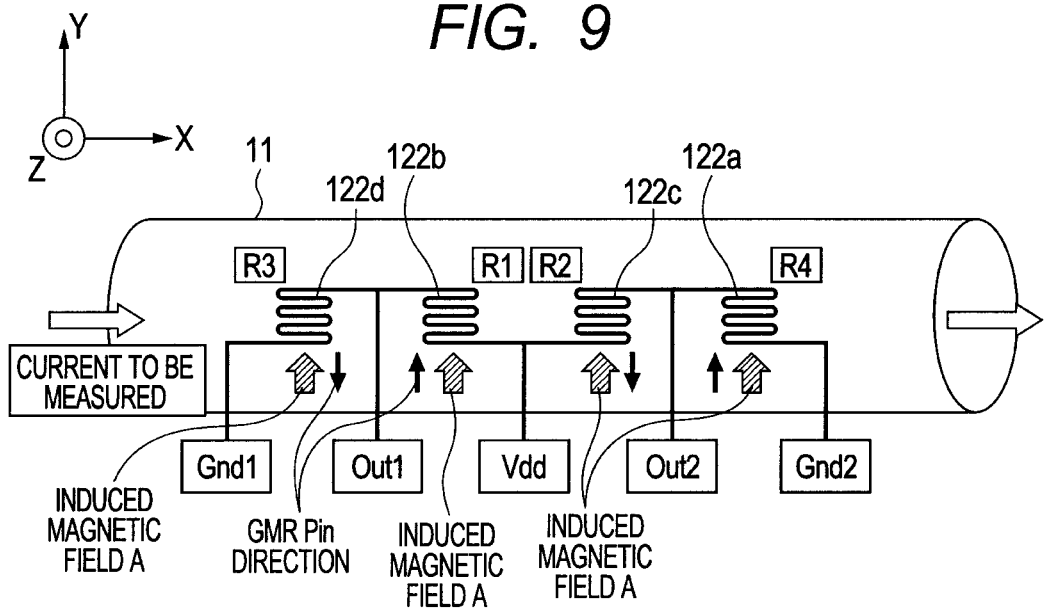
FIG. 9 is a diagram illustrating a wiring pattern of a magnetic detecting bridge circuit in a magnetic balance current sensor according to an embodiment of the present invention.

The present invention can be equally applied to a magnetic proportional current sensor for measuring the current to be measured by the output of two magneto-resistance effect elements in proportion to the induced magnetic field, as well as the magnetic balance current sensor. As shown in FIG. 9, the magnetic proportional current sensor includes a configuration similar to the configuration shown in FIG. 5A, except for the feedback coil. In addition, the magneto-resistance effect element of the magnetic proportional current sensor has four magneto-resistance effect elements 122a to 122d, as shown in FIG. 9, and, similar to the configuration shown in FIGS. 5 to 7, has a wiring symmetrical to a power supply point. Further, the magnetization directions (magnetization direction of the second ferromagnetic film: Pin2) of two magneto-resistance effect elements 122b and 122d outputting the midpoint potential (Out1) are different from each other by 180° (antiparallel), and the magnetization directions (magnetization direction of the second ferromagnetic film: Pin2) of two magneto-resistance effect elements 122a and 122c outputting the midpoint potential (Out2) are different from each other by 180° (antiparallel). In addition, the resistance change rate of the four magneto-resistance effect elements 122a to 122d is equal to each other.

The case where the current sensor according to the present invention is the magnetic proportional current sensor will now be described in detail.

Figure 12:
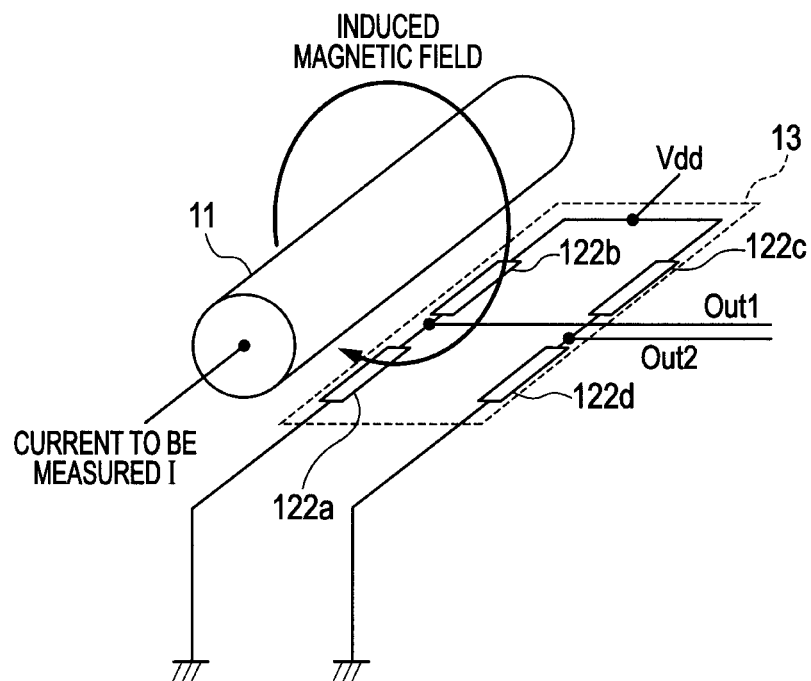
FIG. 12 is a diagram illustrating a magnetic proportional current sensor according to an embodiment of the present invention.
Figure 13:
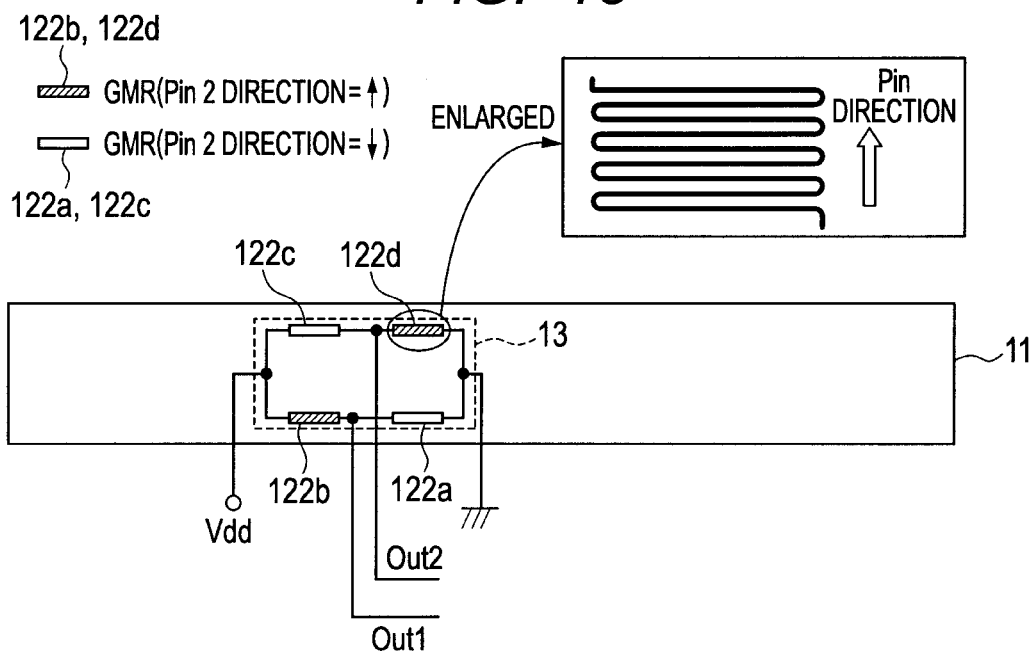
FIG. 13 is a diagram illustrating a magnetic proportional current sensor according to an embodiment of the present invention.

FIGS. 12 and 13 are diagrams illustrating a magnetic proportional current sensor according to an embodiment of the present invention. The magnetic proportional current sensor shown in FIGS. 12 and 13 is installed adjacent to a conductor 11 through which a current I to be measured flows. The magnetic proportional current sensor includes a magnetic field detecting bridge circuit (magnetic detecting bridge circuit) 13 for detecting the induced magnetic field generated from the current I to be measured which flows in the conductor 11. The magnetic field detecting bridge circuit 13 has four magneto-resistance effect elements 122a to 122d of which the resistance value is varied by application of the induced magnetic field from the current I to be measured.

The magnetic field detecting bridge circuit 13 has two outputs for inducing a voltage difference in accordance with the induced magnetic field generated by the current I to be measured. In the magnetic field detecting bridge circuit 13 shown in FIG. 13, a power source Vdd is connected to a connection point between the magneto-resistance effect element 122b and the magneto-resistance effect element 122c, and a ground (GND) is connected to a connection point between the magneto-resistance effect element 122a and the magneto-resistance effect element 122d. In addition, in the magnetic field detecting bridge circuit 13, one output (Out1) is taken from the connection point between the magneto-resistance effect elements 122a and 122b, and the other output (Out2) is taken from the connection point between magneto-resistance effect elements 122c and 122d. The magnetic proportional current sensor calculates the current I to be measured from the voltage difference between two outputs.

Figure 14:
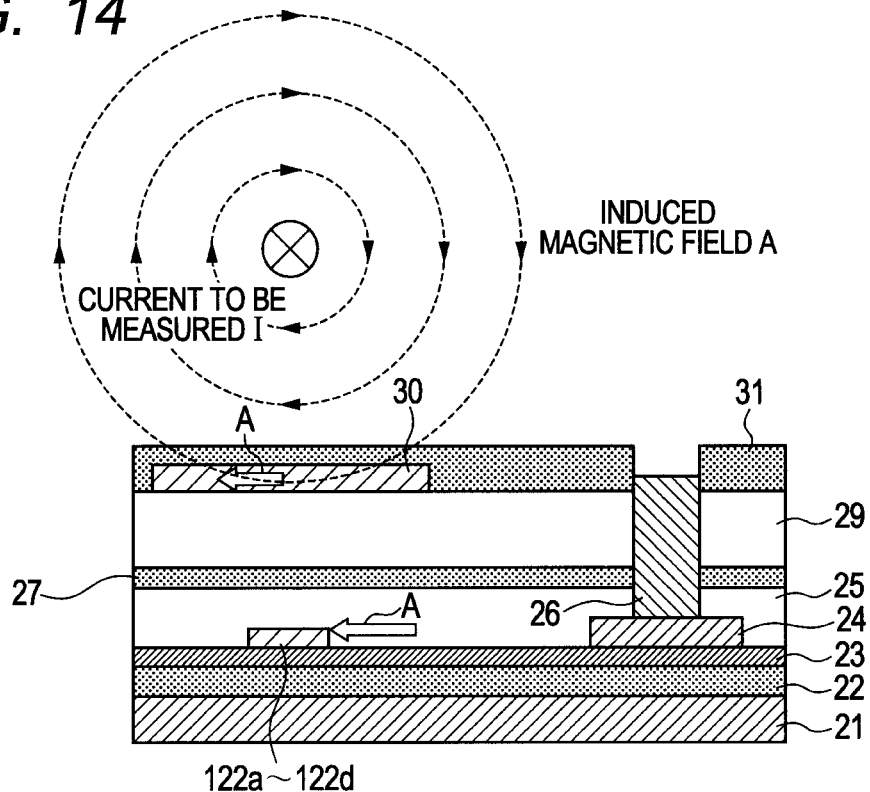
FIG. 14 is a cross-sectional view illustrating the magnetic proportional current sensor in FIG. 12.

FIG. 14 is a cross-sectional view illustrating the magnetic proportional current sensor shown in FIG. 12. As shown in FIG. 14, in the magnetic proportional current sensor according to the embodiment, the magnetic shield and the magnetic field detecting bridge circuit are formed on the same substrate 21. In the configuration shown in FIG. 14, the magnetic shield is placed at a side near to the current I to be measured. That is, the magnetic shield and the magneto-resistance effect element are placed in order from the side near the conductor 11. In this way, the magneto-resistance effect element can be farthest away from the conductor 11, and the induced magnetic field applied to the magneto-resistance effect element from the current I to be measured can be reduced. Accordingly, the current measurement in the wide range is possible.

The layer configuration shown in FIG. 14 will be described in detail. In the magnetic proportional current sensor shown in FIG. 14, a thermal silicon oxide film 22 serving as an insulating layer is formed on the substrate 21. An aluminum oxide film 23 is formed on the thermal silicon oxide film 22. For example, the aluminum oxide film 23 can be formed as a film by a method such as sputtering or the like. In addition, a silicon substrate or the like is used as the substrate 21.

The magneto-resistance effect elements 122a to 122d are formed on the aluminum oxide film 23 to form a magnetic field detecting bridge circuit. As the magneto-resistance effect elements 122a to 122d, a TMR element (tunnel magneto-resistance effect element), a GMR element (giant magneto-resistance effect element), or the like can be used. The film configuration of the magneto-resistance effect element for use in the magnetic proportional current sensor according to the present invention is shown, for example, in FIG. 10. The detailed configuration is described above, and thus the description thereof will be omitted herein.

As the magneto-resistance effect element, a GMR element of a meandering shape is desirable, as shown in the enlarged view of FIG. 13, in which a plurality of belt-like elongated patterns (stripes) are placed in such a way that longitudinal directions thereof are parallel with each other by being folded back. In the meandering shape, an axial direction (Pin direction) of sensitivity is the direction (widthwise direction of the stripes) perpendicular to a longitudinal direction of a long pattern (longitudinal direction of the stripes). In this meandering shape, the induced magnetic field is applied in a direction perpendicular to the longitudinal direction of the stripe (widthwise direction of stripe).

Considering the linearity in the meandering shape, it is desirable that the width of the meandering shape in a Pin direction is 1 μm to 10 μm. In this instance, considering the linearity, it is desirable that the longitudinal direction is perpendicular to the direction of the induced magnetic field. With the meandering shape, it is possible to achieve the output of the magneto-resistance effect element using fewer terminals (two terminals) than Hall elements.

In addition, an electrode 24 is formed on the aluminum oxide layer 23. The electrode 24 may be formed by photolithography and etching after an electrode material is formed as a film.

On the aluminum oxide layer 23 formed with the magneto-resistance effect elements 122a to 122d and the electrode 24, a polyimide layer 25 is formed as an insulating layer. The polyimide layer 25 may be formed by applying and curing a polyimide material.

A silicon oxide film 27 is formed on the polyimide layer 25. The silicon oxide film 27 is formed as a film by, for example, a method such as sputtering. A polyimide layer 29 is formed on the silicon oxide layer 27 as an insulating layer. The polyimide layer 29 may be formed by applying and curing a polyimide material. Further, the silicon oxide layer 27 and the polyimide layer 29 can be appropriately omitted.

A magnetic shield 30 is formed on the polyimide layer 29. The material of the magnetic shield 30 can use a high permeability material such as an amorphous magnetic material, a permalloy-based magnetic material, or an iron-based microcrystalline material. In addition, the magnetic shield 30 can be appropriately omitted.

A silicon oxide layer 31 is formed on the polyimide layer 29. The silicon oxide layer 31 may be formed as a film by, for example, a method such as sputtering. Contact holes are formed in predetermined regions of the polyimide layer 29 and the silicon oxide layer 31 (a region of the electrode 24), and electrode pads 26 are formed in the contact holes. The contact holes are formed by photolithography and etching. The electrode pads 26 may be formed by photolithography and plating after the electrode material is formed as a film.

In the magnetic proportional current sensor including the above-described configuration, as shown in FIG. 14, the magneto-resistance effect element receives the induced magnetic field A generated from the current I to be measured to output a voltage in accordance with the resistance change.

The magnetic proportional current sensor according to the present invention includes the magnetic shield 30, as shown in FIG. 14. The magnetic shield 30 can attenuate the induced magnetic field generated from the current I to be measured and applied to the magneto-resistance effect elements. Accordingly, in a case where the induced magnetic field A is high, the current measurement can be carried out in a wide range. In addition, the effect of the external magnetic field can be reduced by the magnetic shield 30.

The magnetic proportional current sensor including the above-described configuration utilizes the magneto-resistance effect element as the magnetic detecting element, in particular, the magnetic field detecting bridge circuit having the GMR element or the TMR element, so that a magnetic proportional current sensor having high sensitivity can be achieved. In addition, in the magnetic proportional current sensor, the magnetic field detecting bridge circuit is constituted of four magneto-resistance effect elements with the same film configuration. Further, in the magnetic proportional current sensor including the above-described configuration, since the magnetic shield 30 and the magnetic field detecting bridge are formed on the same substrate, miniaturization thereof can be achieved. Moreover, since the magnetic proportional current sensor does not include the magnetic core, miniaturization and cost reduction can be achieved.

Figure 15:
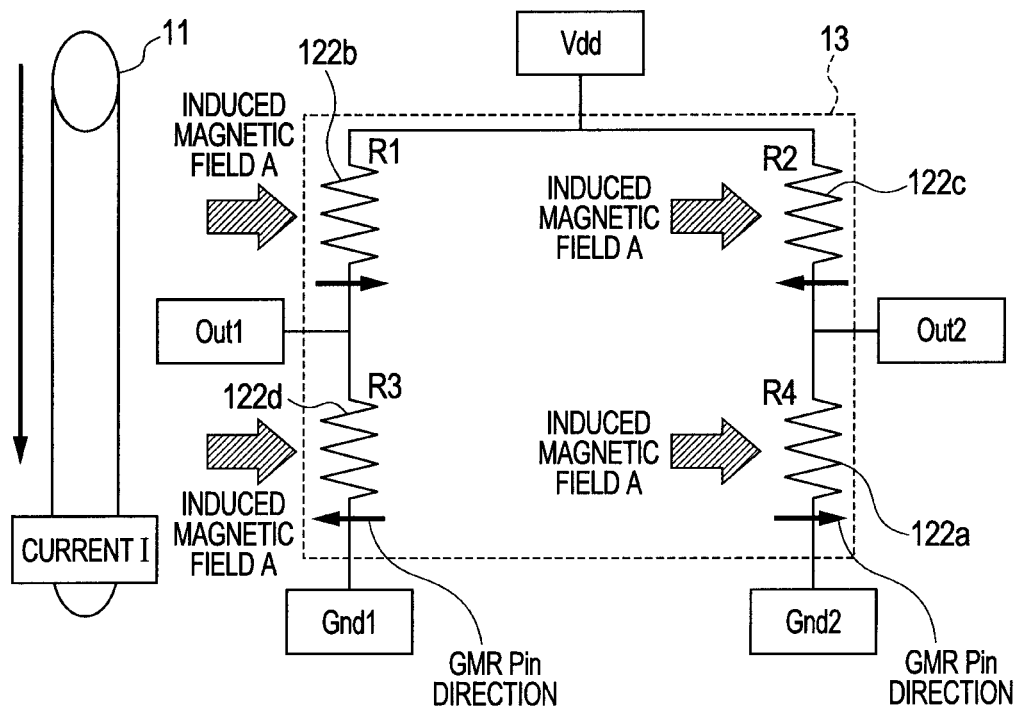
FIG. 15 is a diagram illustrating a magnetic detecting bridge circuit in a magnetic proportional current sensor according to an embodiment of the present invention.

In the magnetic proportional current sensor according to the present invention, as shown in FIG. 15, the magnetization directions (magnetization direction of the second ferromagnetic film: Pin2) of the ferromagnetic fixed layers of the two magneto-resistance effect elements 122b and 122d outputting the midpoint potential (Out1) are different from each other by 180° (antiparallel), and the magnetization directions (magnetization direction of the second ferromagnetic film: Pin2) of the ferromagnetic fixed layers of the two magneto-resistance effect elements 122a and 122c outputting the midpoint potential (Out2) are different from each other by 180° (antiparallel). In addition, the resistance change rate of the four magneto-resistance effect elements 122a to 122d is equal to each other. In a case where the angle of the magnetic field applied to the ferromagnetic fixed layer is equal, it is desirable that the magneto-resistance effect elements 122a to 122d represent the same resistance change rate at the same magnetic strength.

In the magnetic proportional current sensor including the four magneto-resistance effect elements 122a to 122d placed as described above, the current to be measured is measured by the voltage difference between two outputs (Out1 and Out2) of the magnetic field detecting bridge circuit 13.

As shown in FIG. 15, if the current to be measured flows in the direction of the arrow, the induced magnetic field A is respectively applied to the four magneto-resistance effect elements 122a to 122d. In the magnetic field detecting bridge circuit 13, the resistance values of the magneto-resistance effect elements 122a to 122d in a zero magnetic field are equal to each other (Rcom). In addition, the resistance change rates of the magneto-resistance effect elements 122a to 122d are equal to each other. The output between the magneto-resistance effect elements 122b and 122d is set to Out1, and the output between the magneto-resistance effect elements 122a and 122c is set to Out2. Moreover, a resistance value of the magneto-resistance effect element 122b is set to R1, a resistance value of the magneto-resistance effect element 122c is set to R2, a resistance value of the magneto-resistance effect element 122d is set to R3, and a resistance value of the magneto-resistance effect element 122a is set to R4.

When the resistance change amount of the magneto-resistance effect elements 122a to 122d according to the induced magnetic field generated from the current I to be measured is ΔR, a midpoint potential difference (Out1 and Out2) of the bridge is obtained as follows:

Resistance between $Vdd$ and $Gnd1$ =
$$(R1 - \Delta R) + (R3 + \Delta R) = R1 + R3 = 2 \times R_{com}$$

Resistance between $Vdd$ and $Gnd2$ =
$$(R2 + \Delta R) + (R4 - \Delta R) = R2 + R4 = 2 \times R_{com}$$

Potential of $Out1$ =
$$(R3 + \Delta R)/(R1 + R3) \times Vdd = (R_{com} + \Delta R)/(2 \times R_{com}) \times Vdd$$

Potential of $Out2$ =
$$(R4 - \Delta R)/(R2 + R4) \times Vdd = (R_{com} - \Delta R)/(2 \times R_{com}) \times Vdd$$

Potential difference between $Out1$ and $Out2$ =
$$(2 \times \Delta R)/(2 \times R_{com}) \times Vdd = \Delta R/R_{com} \times Vdd$$

As described above, in the magnetic proportional current sensor including the magnetic detecting bridge circuit according to the present invention, a term ΔR is not contained in a denominator in the equation of the bridge midpoint potential difference for obtaining the potential difference between Out1 and Out2. For this reason, the output of the midpoint potential difference is varied in proportion to the induced magnetic field which is generated by the current I to be measured. As a result, it is possible to carry out the current measurement with a high degree of accuracy. In addition, since the wiring pattern is symmetrical to the power supply point, there is no difference in the wiring resistances at both sides of the power supply point. As a result, since there is no misalignment of the midpoint potential caused by the difference in wiring resistances, it is possible to carry out the current measurement with a high degree of accuracy. The present invention is particularly useful in a magnetic proportional current sensor.

Figure 10B:
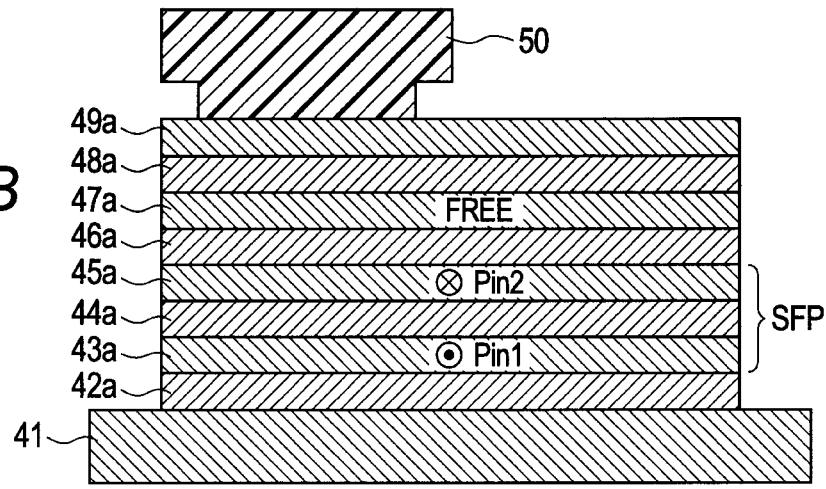
Figure 10C:
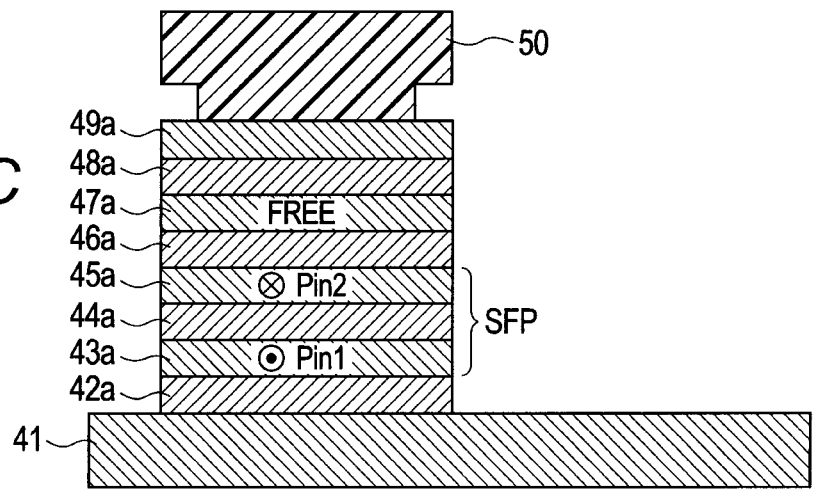

FIGS. 10A to 10C and FIGS. 11A and 11C are diagrams illustrating a method of manufacturing the magneto-resistance effect element in the current sensor according to an embodiment of the present invention. First, as shown in FIG. 10A, the seed layer 42a, the first ferromagnetic film 43a, the antiparallel coupling film 44a, the second ferromagnetic film 45a, the non-magnetic intermediate layer 46a, the soft magnetic free layers (free magnetic layer) 47a and 48a, and the protective layer 49a are sequentially formed on the substrate 41. During film formation of the first ferromagnetic film 43a and the second ferromagnetic film 45a, the magnetic field is applied to the first ferromagnetic film and the second ferromagnetic film in the widthwise direction of the stripes of the meandering shape. In FIGS. 10A to 10C, the applying direction of the magnetic field for the first ferromagnetic film 43a is a direction facing a front side from a front surface of the paper, and the applying direction of the magnetic field for the second ferromagnetic film 45a is a direction facing a lateral side from the front surface of the paper. During film formation of the soft magnetic free layers (free magnetic layer) 47a and 48a, the magnetic field is applied to the soft magnetic free layers in the longitudinal direction of the stripes of the meandering shape.

Next, as shown on FIG. 10B, a resistor layer 50 is formed on the protective layer 49a, and then the resistor layer 50 is left on the region of the magneto-resistance effect element 122a side by photolithography and etching. Then, as shown in FIG. 10C, the exposed stacked film is removed by ion milling or the like to expose a region of the substrate 41 in which the magneto-resistance effect element 122b is provided.

Figure 11A:
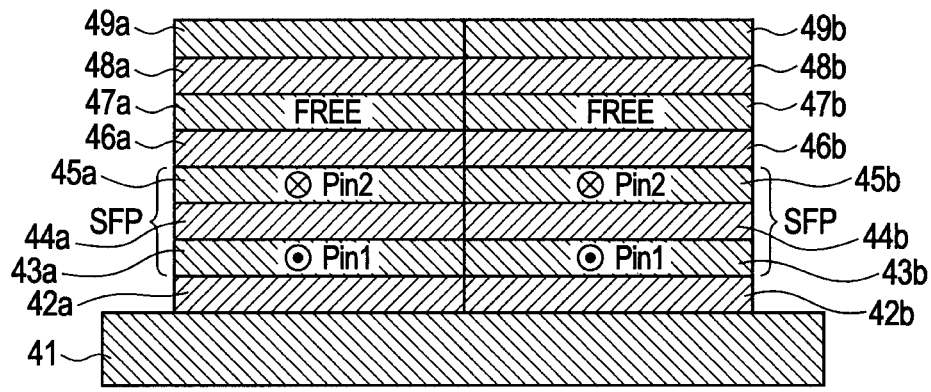
FIGS. 11A to 11C are diagrams illustrating a method of manufacturing a magneto-resistance effect element in a current sensor according to an embodiment of the present invention.
Figure 11B:
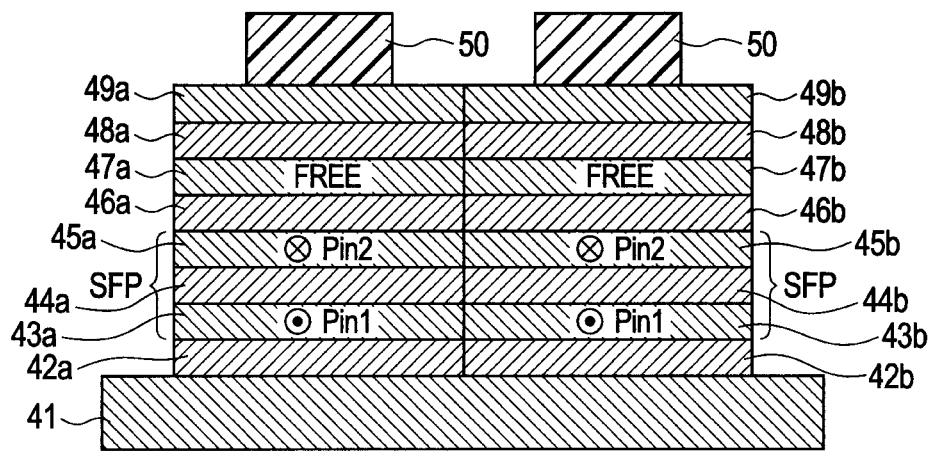
Figure 11C:
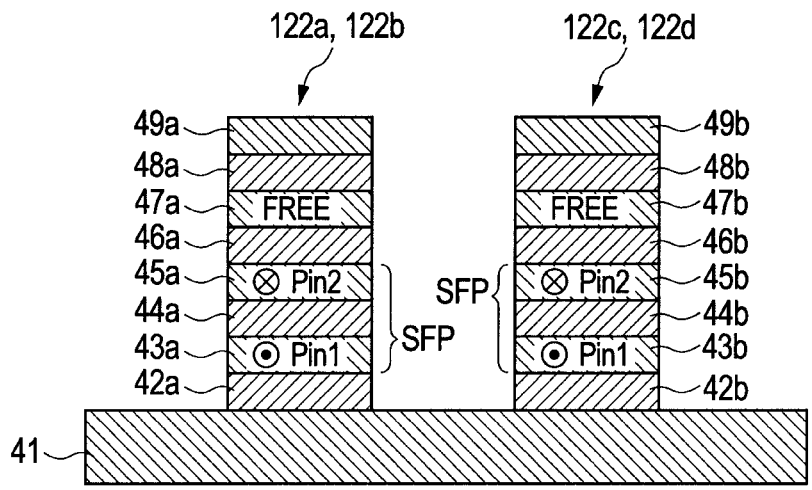

Then, as shown in FIG. 11A, a seed layer 42b, a first ferromagnetic film 43b, an antiparallel coupling film 44b, a second ferromagnetic film 45b, a non-magnetic intermediate layer 46b, soft magnetic free layers (free magnetic layer) 47b and 48b, and a protective layer 49b are sequentially formed on the exposed substrate 41. During film formation of the first ferromagnetic film 43b and the second ferromagnetic film 45b, the magnetic field is applied to the first ferromagnetic film and the second ferromagnetic film in the widthwise direction of the stripes of the meandering shape. In FIGS. 11A to 11C, the applying direction of the magnetic field for the first ferromagnetic film 43b is a direction facing a front side from a front surface of the paper, and the applying direction of the magnetic field for the second ferromagnetic film 45b is a direction facing a lateral side from the front surface of the paper. During film formation of the soft magnetic free layers (free magnetic layer) 47b and 48b, the magnetic field is applied to the soft magnetic free layers in the longitudinal direction of the stripes of the meandering shape.

Next, as shown on FIG. 11B, a resistor layer 50 is formed on the protective layers 49a and 49b, and then the resistor layer 50 is remained on the formation region of the magneto-resistance effect elements 122a to 122d by photolithography and etching. Then, as shown in FIG. 11C, the exposed stacked film is removed by ion milling or the like to form the magneto-resistance effect elements 122a to 122d.

As described above, with the current sensor according to the present invention, since the magnetization directions of the self-pinned type ferromagnetic fixed layers in the two magneto-resistance effect elements outputting the midpoint potential are different from each other by 180°, the output of the midpoint potential difference is changed in proportion to the induced magnetic field which is generated from the current to be measured in the magnetic detecting bridge circuit. In addition, there is no difference in the wiring resistances in the magnetic detecting bridge circuit, and it is possible to carry out the current measurement with a high degree of accuracy.

The present invention is not limited to the embodiments, but may be variously modified. For example, the material, the connected relation of each element, the thickness, the size, and the manufacturing method in the embodiments may be variously modified. In addition, the present invention may be variously modified without departing from the scope of the invention.

The present invention can be applied to a current sensor for detecting the intensity of a current to drive a motor of an electric vehicle.

It should be understood by those skilled in the art that various modifications, combinations, sub-combinations and alterations may occur depending on design requirements and other factors insofar as they are within the scope of the appended claims or the equivalents thereof.

What is claimed is:

1. A current sensor comprising:
 a conductor through which a current to be measured flows; and
 a magnetic detecting bridge circuit formed of four magneto-resistance effect elements with a resistance value varied by application of an induced magnetic field from the current to be measured, the four magneto-resistance effect elements having a same resistance change rate, each of the four magneto-resistance effect elements having a laminated structure including:
  a self-pinned type ferromagnetic fixed layer formed of a first ferromagnetic film and a second ferromagnetic film anti-ferromagnetically coupled to each other;
  a nonmagnetic intermediate layer; and
  a soft magnetic free layer,
 wherein the laminated structure does not include any layer made of antiferromangnetic material,
 wherein the magneto detecting bridge circuit has an output between two of the four magneto-resistance effect elements, magnetization directions of the ferromagnetic fixed layers of the two magneto-resistance effect elements being different from each other by 180°,
 wherein the magnetic detecting bridge circuit has a wiring symmetrical to a power supply point,
 wherein the magnetic detecting bridge circuit measures the current to be measured by the outputs of the four magneto-resistance effect elements which are in proportion to the induced magnetic field,
 wherein each of the magneto-resistance effect elements has a meandering shape including a plurality of stripes, each of the plurality of stripes being perpendicular to the induced magnetic field extended from the conductor,
 and wherein the magnetization direction, which is a pin-direction, of each of the ferromagnetic fixed layers is perpendicular to the stripes in each of the magneto-resistance effect elements.

2. The current sensor according to claim 1, wherein the first ferromagnetic film is made of a CoFe alloy containing Fe of 40 atomic percent to 80 atomic percent, and the second ferromagnetic film is made of a CoFe alloy containing Fe of more than 0 atomic percent up to 40 atomic percent.

3. The current sensor according to claim 1, further comprising:
 a magnetic shield configured to attenuate the induced magnetic field and to enhance the cancelling magnetic field.

4. The current sensor according to claim 3, wherein the magnetic shield is made of a high permeability material selected from a group consisting of an amorphous magnetic material, a permalloy-based magnetic material, and an iron-based microcrystalline material.

5. The current sensor according to claim 1, wherein the first ferromagnetic film and the second ferromagnetic film are anti-ferromagnetically coupled to each other via an antiparallel coupling film interposed therebetween.

6. The current sensor according to claim 1, wherein the first ferromagnetic film has a magnetization $Ms_1$ per volume and a thickness $t_1$, the second ferromagnetic film has a magnetization $Ms_2$ per volume and a thickness $t_2$, a magnetization amount $(Ms_1 \cdot t_1)$ of the first ferromagnetic film and a magnetization amount $(Ms_2 \cdot t_2)$ of the second ferromagnetic film are substantially equal to each other.

7. The current sensor according to claim 1, wherein the first ferromagnetic film has a first coercive force, and the second ferromagnetic film has a second coercive force smaller than the first coercive force.

8. The current sensor according to claim 1, wherein the first ferromagnetic film and the second ferromagnetic film in one of the magneto-resistance effect elements are magnetized by applying a magnetic field thereto in a first direction along a width direction of the stripes, while the first ferromagnetic film and the second ferromagnetic film in another of the magneto-resistance effect elements are magnetized by applying the magnetic field thereto in a second direction different from the first direction.

9. The current sensor according to claim 8, wherein the second direction is opposite to the first direction.

10. The current sensor according to claim 3, further comprising:
 an insulating layer formed between the magnetic shield and the magneto-resistance effect elements, the insulating layer formed by a heating process after the magneto-resistance effect elements are formed.

11. The current sensor according to claim 1, wherein the self-pined type ferromagnetic fixed layer consists of:
 the first ferromagnetic film;
 the second ferromagnetic film; and
 an antiparallel coupling film interposed therebetween.

* * * * *